(12) United States Patent
Racz et al.

(10) Patent No.: US 11,480,590 B2
(45) Date of Patent: *Oct. 25, 2022

(54) OFFSET CURRENT SENSOR STRUCTURE

(71) Applicant: Melexis Technologies SA, Bevaix (CH)

(72) Inventors: Robert Racz, Zug (CH); Amalia Spataru, Neuchatel (CH); Simon Houis, Neuchatel (CH); Bruno Boury, Kontich (BE); Javier Bilbao De Mendizabal, Zurich (CH)

(73) Assignee: MELEXIS TECHNOLOGIES SA, Bevaix (CH)

( * ) Notice: Subject to any disclaimer, the term of this patent is extended or adjusted under 35 U.S.C. 154(b) by 0 days.

This patent is subject to a terminal disclaimer.

(21) Appl. No.: 16/241,059

(22) Filed: Jan. 7, 2019

(65) Prior Publication Data

US 2019/0212371 A1 Jul. 11, 2019

(30) Foreign Application Priority Data

Jan. 5, 2018 (EP) ..................................... 18150505

(51) Int. Cl.
*G01R 19/00* (2006.01)
*G01R 15/20* (2006.01)
(Continued)

(52) U.S. Cl.
CPC ....... G01R 19/0092 (2013.01); G01R 15/202 (2013.01); G01R 15/205 (2013.01);
(Continued)

(58) Field of Classification Search
CPC .......................... G01R 19/0092; G01R 15/202; G01R 15/205; G01R 15/207; G01R 33/0005; G01R 33/07; G01R 33/09
See application file for complete search history.

(56) References Cited

U.S. PATENT DOCUMENTS 4,516,070 A   5/1985   Brown et al.
4,536,706 A   8/1985   Kemper
(Continued)

FOREIGN PATENT DOCUMENTS

EP      2948779 A1      12/2015
WO   2017010219 A1       1/2017

OTHER PUBLICATIONS

Extended European Search Report from EP Application No. 18150505. 8, dated Jul. 19, 2018.
(Continued)

*Primary Examiner* — Feba Pothen
(74) *Attorney, Agent, or Firm* — Workman Nydegger

(57) ABSTRACT

The present invention relates to a current-sensor structure comprising a conductor for conducting electrical current in a current direction. The conductor has one or more conductor surfaces. At least one current sensor is disposed on, over, adjacent to or in contact with the conductor and is offset from a centre of the conductor in an offset direction orthogonal to the current direction and optionally parallel to a conductor surface. The current-sensor structure can comprise a substrate on which the conductor is disposed. The current sensor can be located on a side of the conductor opposite or orthogonal to a surface of the substrate. The current sensor can be aligned with, near to or adjacent to an edge of the conductor. The current-sensor structure can comprise a shield, such as a U-shaped laminated shield that at least partially surrounds the conductor and the current sensor.

21 Claims, 20 Drawing Sheets

(51) Int. Cl.
*G01R 33/00* (2006.01)
*G01R 33/07* (2006.01)
*G01R 33/09* (2006.01)

(52) U.S. Cl.
CPC ....... *G01R 15/207* (2013.01); *G01R 33/0005* (2013.01); *G01R 33/07* (2013.01); *G01R 33/09* (2013.01)

(56) References Cited

U.S. PATENT DOCUMENTS

| | | | |
|---|---|---|---|
| 5,831,426 | A | 11/1998 | Black, Jr. et al. |
| 6,812,687 | B1* | 11/2004 | Ohtsuka ............... G01R 15/202 324/117 H |
| 7,635,993 | B2 | 12/2009 | Boeve |
| 8,760,149 | B2 | 6/2014 | Ausserlechner |
| 9,222,992 | B2 | 12/2015 | Ausserlechner et al. |
| 9,291,648 | B2 | 3/2016 | Snoeij et al. |
| 10,281,497 | B2* | 5/2019 | Shimizu ................ G01R 15/20 |
| 2005/0030018 | A1* | 2/2005 | Shibahara ............. G01R 15/20 324/251 |
| 2008/0186021 | A1 | 8/2008 | Hashio et al. |
| 2009/0121704 | A1* | 5/2009 | Shibahara ............ G01R 15/202 324/117 R |
| 2010/0026286 | A1 | 2/2010 | Koss et al. |
| 2013/0138372 | A1* | 5/2013 | Ausserlechner ..... G01R 35/005 702/65 |
| 2015/0015241 | A1* | 1/2015 | Tamura ................. G01R 15/20 324/117 R |
| 2016/0109550 | A1 | 4/2016 | Peczalski et al. |
| 2017/0082663 | A1 | 3/2017 | Hebiguchi |
| 2017/0184635 | A1* | 6/2017 | Ugge ................... G01R 15/207 |
| 2018/0031613 | A1* | 2/2018 | Nakayama ............ G01R 33/05 |
| 2018/0038898 | A1 | 2/2018 | Shimizu |

OTHER PUBLICATIONS

Office Communication from corresponding EP Application No. 18150505.8, dated Oct. 25, 2019.

* cited by examiner

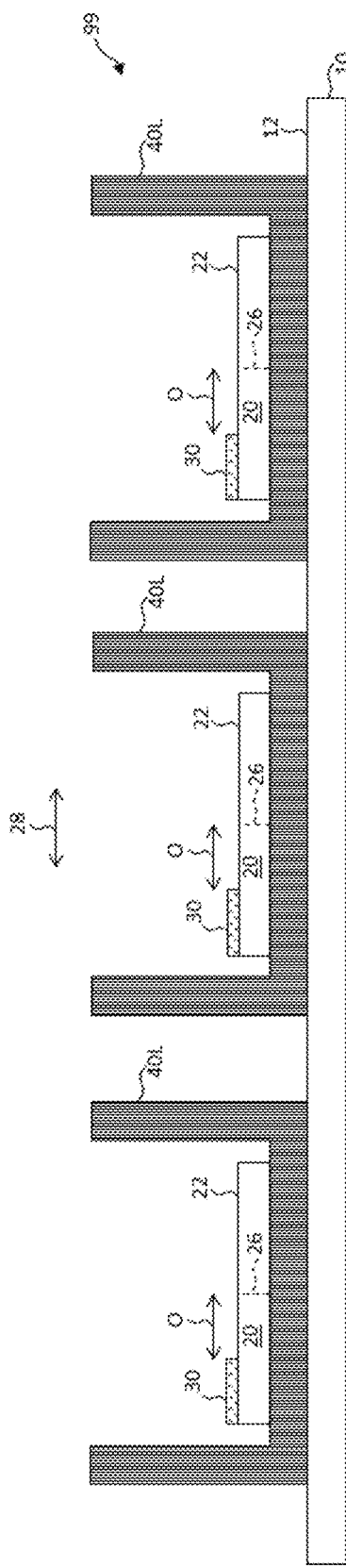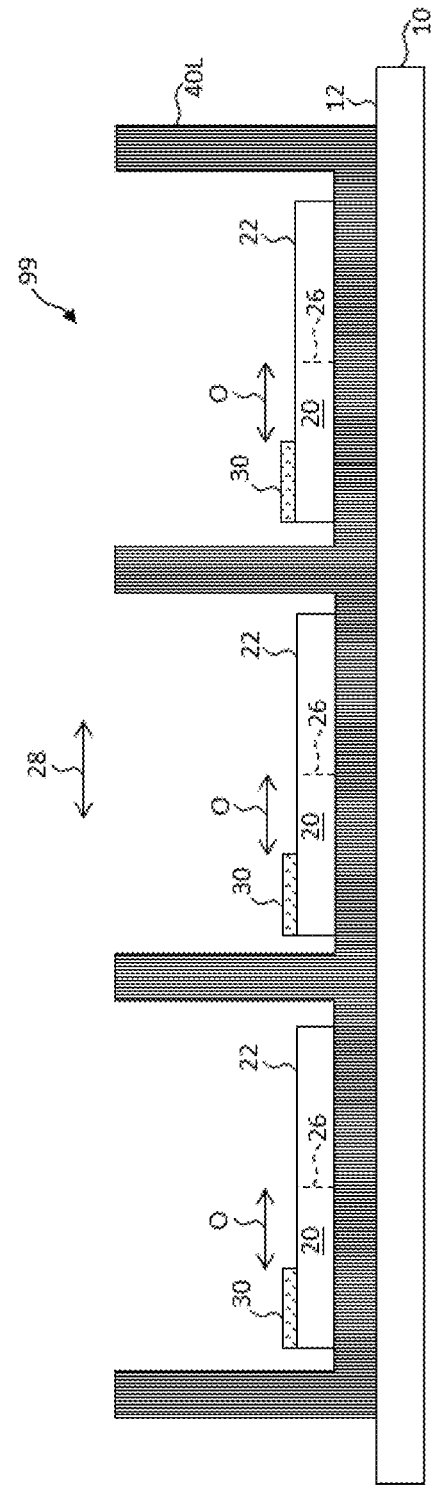

Current density variations with frequency

Unlaminated

Laminated + necked-down Bus Bar

OFFSET CURRENT SENSOR STRUCTURE

FIELD OF THE INVENTION

The present invention is generally related to the field of integrated current sensor structures.

BACKGROUND OF THE INVENTION

Sensors are widely used in electronic devices to measure attributes of the environment and report a measured sensor value. In particular, magnetic sensors are used to measure magnetic fields, for example in transportation systems such as automobiles. Magnetic sensors can incorporate Hall-effect sensors that generate an output voltage proportional to an applied magnetic field or magneto-resistive materials whose electrical resistance changes in response to an external magnetic field.

A current sensor is a device that detects electric current (AC or DC) in a wire and generates a signal proportional to that current. The generated signal can be an analog voltage or a current or even a digital output. One method for detecting and measuring an electrical current in an electrically conductive wire uses a Hall sensor based on the Hall effect. The Hall effect is the production of a voltage difference (the Hall voltage) across an electrically conductive material (such as a wire), transverse to an electric current in the material and to an applied magnetic field perpendicular to the current. The voltage difference can be measured and, if the applied magnetic field is known, the current in the electrically conductive material can be deduced. Such a current sensor can be called a magnetic current sensor. For example, U.S. Pat. No. 5,831,426 describes a current determiner that extends along a substrate in a direction perpendicular to the extent of the input conductor. U.S. Pat. No. 9,291,648, US2016/109550, U.S. Pat. Nos. 7,635,993, 4,536,706, 4,516,070, 8,760,149 and 9,222,992 all describe magnetic current sensors.

It is important to exclude stray magnetic fields from the magnetic current sensor. Since the current deduced is dependent on the local magnetic field applied to the magnetic sensor, any unknown or undesirable magnetic field can cause incorrect measurements. It is also important to provide a consistent and accurate current measurement at the moment of measurement for both direct and alternating electrical currents for a wide range of frequencies.

There is a need therefore, for current-sensor structures that provide consistent and accurate current measurements in environments with stray magnetic fields and for electrical currents having a wide frequency range from direct current to alternating currents with frequencies up to several kHz or even MHz.

SUMMARY OF THE INVENTION

It is an object of embodiments of the present invention to provide for a current sensor structure that reduces or overcomes the above-mentioned limitations.

The above objective is accomplished by the solution according to the present invention.

Embodiments of the present invention provide a current sensor structure comprising a conductor for conducting electrical current in a current direction, the conductor having one or more conductor surfaces. A current sensor is disposed on, over, adjacent to or in contact with the conductor and is offset from a centre of the conductor in an offset direction orthogonal to the current direction. In an embodiment the offset direction is parallel to a conductor surface. The conductor can have a length, a width and a thickness, where the length is greater than the width, the width is greater than the thickness and the offset direction is in the width direction, in the thickness direction or in both the width and thickness directions.

In embodiments of the present invention the current sensor comprises one or more integrated circuits and a printed circuit board on which the integrated circuit(s) is/are disposed. In embodiments one of the integrated circuits comprises a sensor circuit.

In embodiments of the present invention the conductor is free-standing, for example a solid metal bar that stands by itself, for example a copper bar. In other embodiments of the present invention the current-sensor structure comprises a substrate having a substrate surface, wherein the conductor is disposed on, over, in contact with or adjacent to the substrate surface and wherein the current sensor is disposed adjacent to, in contact with, on or above a conductor surface of the conductor opposite the substrate surface or a conductor surface of the conductor orthogonal to the substrate surface. The substrate surface can be planar or substantially planar. The substrate can be a printed circuit board. In other embodiments the conductor is integrated or embedded within the substrate or a printed circuit board, for example a power printed circuit board comprising integrated power traces, wires or vias, such as copper lines, and the current sensor is disposed adjacent to, in contact with, on or adjacent to the substrate or printed circuit board.

In some configurations the conductor has an edge and the current sensor is aligned with the conductor edge. The edge can be rounded or curved. The conductor can have a width W and the current sensor can be disposed an offset distance O in the offset direction from the centre of the conductor that is greater than or equal to W/5, W/2.5 or 2 W (two times W). In other embodiments the current sensor can be disposed an offset distance O in the offset direction from the centre of the conductor that is greater than or equal to W/2, W/3, W/4, W/5 or W/6. Alignment can be within manufacturing or placement tolerances.

In some embodiments the current sensor structure comprises a plurality of current sensors. In some embodiments each current sensor of the plurality of current sensors is offset from a centre of the conductor in an offset direction orthogonal to the current direction and, optionally, parallel to a conductor surface. A first current sensor of the plurality of current sensors can be disposed on over, in contact with, or adjacent to a first conductor surface of the conductor and a second current sensor of the plurality of current sensors can be disposed on, over, in contact with or adjacent to a second conductor surface of the conductor opposite the first conductor surface. The conductor surfaces can be the same surface, different surfaces or opposing different surfaces. A first current sensor of the plurality of current sensors and a second current sensor of the plurality of current sensors can be disposed on over, in contact with or adjacent to a same conductor surface of the conductor, or the plurality of current sensors can be placed symmetrically with respect to the conductor centre or can be disposed axially symmetrically with respect to the length of the conductor.

In some configurations the conductor has a top surface area and a side surface area smaller than the top surface area and the first current sensor and the second current sensor are both disposed in a line or plane parallel to the top surface or the first current sensor and the second current sensor are both disposed in a line or plane parallel to the side surface.

In various configurations the first current sensor and the second current sensor are both disposed in a line orthogonal to the substrate surface or are both disposed in a line or plane parallel to the substrate surface. In some configurations the first current sensor and the second current sensor are both disposed in a line or plane orthogonal to the conductor surface or are both disposed in a line or plane parallel to the conductor surface. The first current sensor and the second current sensor can be offset in the current direction.

In embodiments of the present invention the current sensor structure comprises a shield, for example a ferromagnetic shield, at least partially surrounding the conductor and the current sensor. The conductor can be disposed in, on, in contact with or over the shield, or on a layer disposed on the shield. A cross section of the shield in a direction orthogonal to the current direction and the substrate surface can form a plane, two parallel planes or a U-shape comprising vertical portions that extend vertically with respect to the substrate surface or from a bottom surface of the shield. The bottom surface of the shield can be in contact with a surface of the conductor or the substrate surface. The vertical portions of the shield can be parallel or disposed in parallel planes. The shield can be laminated or can comprise a single material.

In some embodiments of the current-sensor structure the conductor has a notch and the current sensor is disposed adjacent to the notch. In other embodiments of the current-sensor structure the conductor has a hole or slot and the current sensor is disposed adjacent to the hole or slot.

In embodiments of the present invention the conductor has a U-shape in a cross section orthogonal to the direction of current flow. At least two current sensors can be disposed in relation to the conductor to measure the magnetic field generated by the electrical current in different or opposite directions and to measure an external magnetic field in the same direction, enabling cancellation of external magnetic fields.

The conductor or the shield can be laminated or both the conductor and the shield can be laminated. The laminated shield can comprise lamination layers and the lamination layers can be disposed orthogonally to the current direction, parallel to the current direction, parallel to the substrate surface, parallel to a thickness or length surface of the conductor, or perpendicular to the substrate surface, perpendicular to a thickness or length surface of the conductor, or in any other direction. The shield can comprise a single ferromagnetic material or can contain one or more lamination layers or ferromagnetic material or other magnetic field material.

In embodiments of the present invention the current-sensor structure comprises three or more conductors, each conductor having a longest dimension extending in a similar, parallel direction, each conductor conducting a phase of a three-phase current, and at least two conductors of the three or more conductors having at least one current sensor or having at least two current sensors.

Embodiments of the present invention provide a current-sensor structure having improved stability and consistency in magnitude and phase measurements of magnetic fields corresponding to alternating currents of different frequencies in an electrical conductor and improved immunity to or rejection of external magnetic fields, such as cross field sensitivity.

For purposes of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught herein without necessarily achieving other objects or advantages as may be taught or suggested herein.

The above and other aspects of the invention will be apparent from and elucidated with reference to the embodiment(s) described hereinafter.

BRIEF DESCRIPTION OF THE DRAWINGS

The invention will now be described further, by way of example, with reference to the accompanying drawings, wherein like reference numerals refer to like elements in the various figures.

FIGS. 5C-5J are cross sections of alternative illustrative embodiments of the present invention.

DETAILED DESCRIPTION OF ILLUSTRATIVE EMBODIMENTS

Figure 1A:
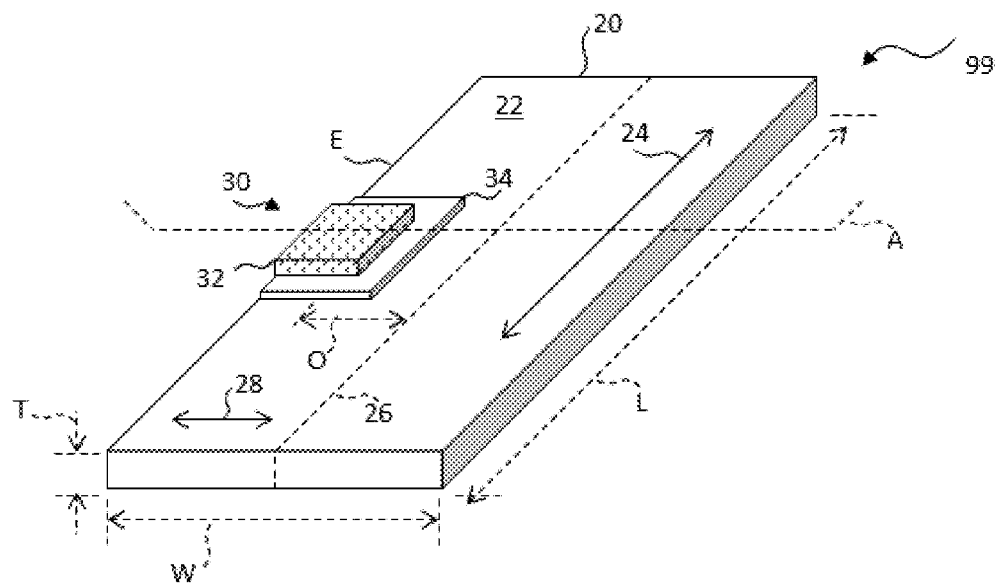
FIG. 1A is a perspective of an illustrative embodiment of the present invention.

The present invention will be described with respect to particular embodiments and with reference to certain drawings but the invention is not limited thereto but only by the claims. The features and advantages of the present disclosure will become more apparent from the detailed description set forth below when taken in conjunction with the drawings, in which like reference characters identify corresponding elements throughout. In the drawings, like reference numbers generally indicate identical, functionally similar, and/or structurally similar elements. The figures are not drawn to scale since the variation in size of various elements in the Figures is too great to permit depiction to scale.

Furthermore, the terms first, second and the like in the description and in the claims, are used for distinguishing between similar elements and not necessarily for describing a sequence, either temporally, spatially, in ranking or in any other manner. It is to be understood that the terms so used are interchangeable under appropriate circumstances and that the embodiments of the invention described herein are capable of operation in other sequences than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Reference throughout this specification to "one embodiment" or "an embodiment" means that a particular feature, structure or characteristic described in connection with the embodiment is included in at least one embodiment of the present invention. Thus, appearances of the phrases "in one embodiment" or "in an embodiment" in various places throughout this specification are not necessarily all referring to the same embodiment, but may. Furthermore, the particular features, structures or characteristics may be combined in any suitable manner, as would be apparent to one of ordinary skill in the art from this disclosure, in one or more embodiments.

Similarly it should be appreciated that in the description of exemplary embodiments of the invention, various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Rather, as the following claims reflect, inventive aspects lie in less than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some but not other features included in other embodiments, combinations of features of different embodiments are meant to be within the scope of the invention, and form different embodiments, as would be understood by those in the art. For example, in the following claims, any of the claimed embodiments can be used in any combination.

It should be noted that the use of particular terminology when describing certain features or aspects of the invention should not be taken to imply that the terminology is being re-defined herein to be restricted to include any specific characteristics of the features or aspects of the invention with which that terminology is associated.

In the description provided herein, numerous specific details are set forth. However, it is understood that embodiments of the invention may be practiced without these specific details. In other instances, well-known methods, structures and techniques have not been shown in detail in order not to obscure an understanding of this description.

Figure 1B:
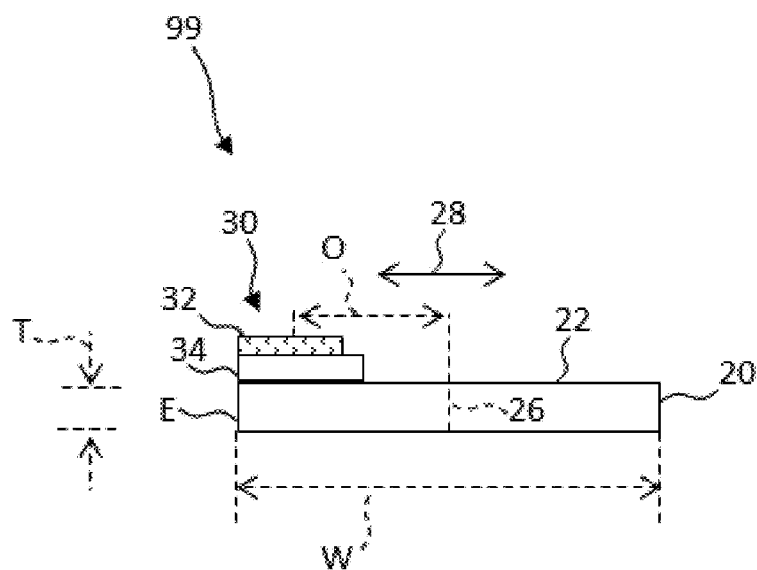
FIG. 1B is a cross section taken across cross section line A of FIG. 1A.
Figure 1C:
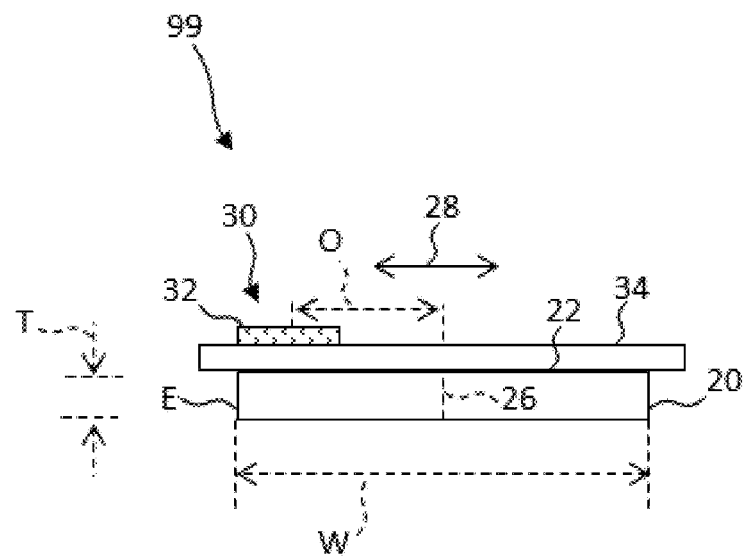
FIG. 1C is a cross section of an illustrative embodiment of the present invention having a larger printed circuit board size.

Embodiments of the present invention provide a current sensor with improved sensing performance for alternating electrical currents of different frequencies in an electrical conductor. Referring to FIGS. 1A, 1B and 1C as well as other figures described below, a current-sensor structure 99 comprises an electrical conductor 20 for conducting electrical current in a current direction 24. The conductor 20 can have a plurality of conductor surfaces 22 and can be a laminated structure with different electrically isolated layers of materials, for example electrically conductive materials. A current sensor 30 for sensing a magnetic field local to the conductor 20 is disposed on, directly on, over, in contact with, for example in direct contact with, above, below or adjacent to a conductor surface 22 of the conductor 20. In embodiments the current sensor 30 is disposed directly on the conductor 20, a conductor surface 22 or on a layer on the conductor 20 or conductor surface 22.

Figure 12A:
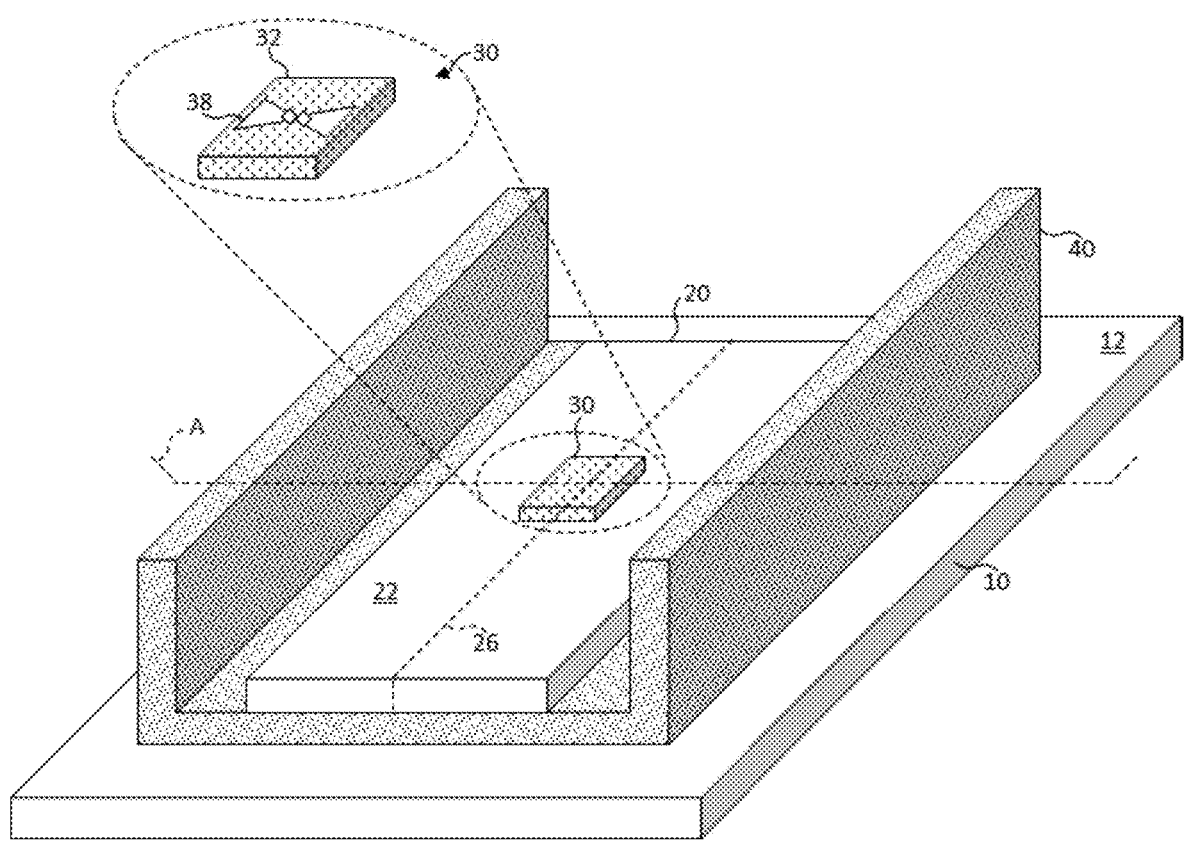
FIG. 12A is a perspective illustrating a current-sensor structure together with an inset detail of a current sensor and FIG. 12B is a cross section of the structure taken across cross section line A of FIG. 12A together with an inset detail of a current sensor.
Figure 12B:
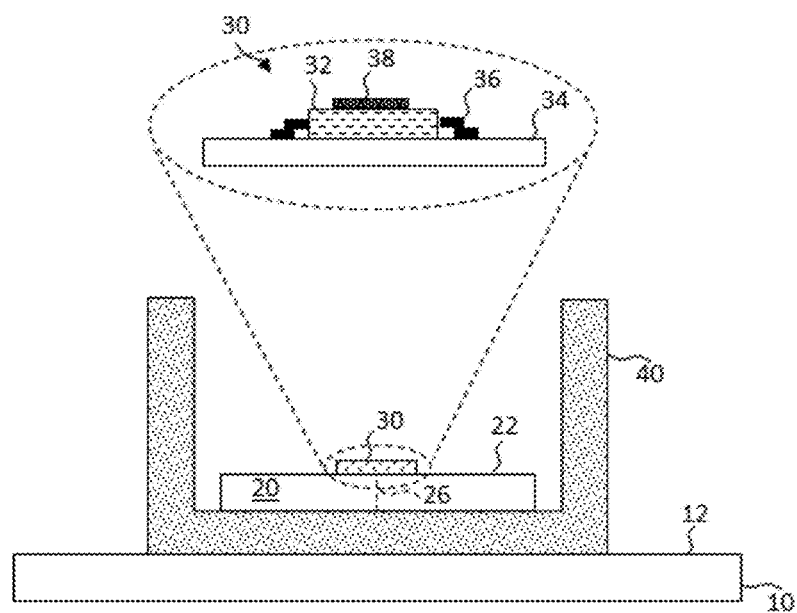

Referring also to FIGS. 12A and 12B, the current sensor 30 can comprise an integrated circuit 32 that can be molded in a package and disposed on a printed circuit board 34 or other wiring substrate. The integrated circuit 32 can be electrically connected to any one or any combination of wires, a lead frame, solder bumps and other electrical conductors on the printed circuit boards 34 using leads or pins 36 on the integrated circuit 32 package and electrically connected to circuits in the integrated circuit 32. The printed circuit board 34 can include only integrated circuits that sense currents (and is relatively small) or can include other integrated circuits that provide control or signal processing capabilities (and is relatively large). The integrated circuit 32 can also include an integrated magnetic concentrator 38 (IMC, as shown in the insets for FIGS. 12A and 12B) in order to sense a magnetic field parallel to the surface of the conductor. Alternative magnetic sensor technologies such as giant magnetoresistive sensors (GMR), tunnelling magnetoresistive sensors (TMR), anisotropic magnetoresistive sensors (AMR), flux gates or Rogowski coils, for example that sense in-plane magnetic fields, can also be used instead of a Hall sensor and IMC. In-plane magnetic fields can be parallel to the conductor surface 22 or to an average height of the conductor surface 22, if the conductor surface 22 is not planar. In other embodiments a vertical Hall sensor is used. In other embodiments a two-axis or three-axis magnetic field sensor is used (employing the Hall effect, AMR, GMR, or any other suitable sensing technology).

Figure 1D:
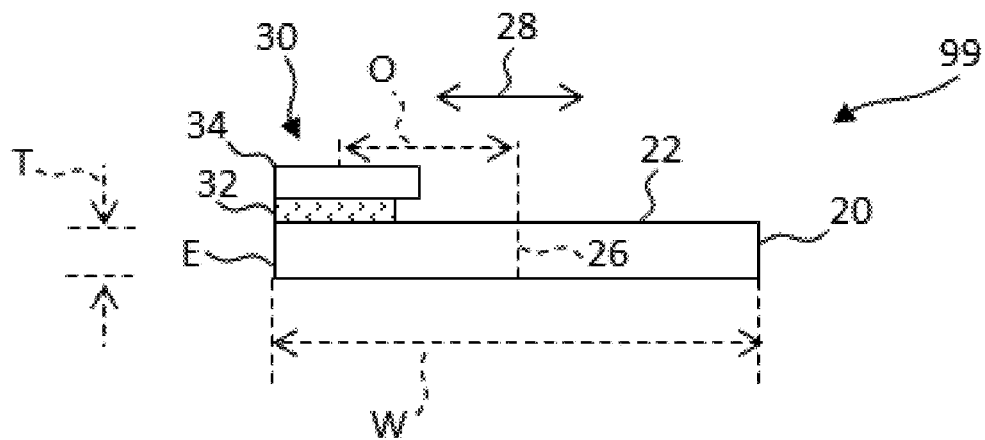
FIG. 1D is a cross section of an illustrative alternative embodiment of the present invention.

As shown in FIGS. 1A, 1B, 1C, 12A and 12B, the integrated circuit 32 is on a side of the printed circuit board 34 opposite the conductor 20 (i.e. the integrated circuit 32 is on the opposite side of the printed circuit board 34 from the conductor 20) so that the printed circuit board 34 is between the integrated circuit 32 and the conductor 20. As shown in FIGS. 1A and 1B, the printed circuit board has a width less than the width of the conductor 20 but greater than the width of the integrated circuit 32. Referring to FIG. 1C, the printed circuit board has a width greater than the width of the conductor 20 and the width of the integrated circuit 32. In alternative embodiments, referring to FIG. 1D, the integrated circuit 32 is between the printed circuit board 34 and the conductor 20. In some embodiments of the present invention the printed circuit board comprises a ground plane, for example an expanded ground layer, or power plane between the integrated circuit 32 and the conductor 20 (i.e. as shown in FIGS. 1A and 1B) that reduces the capacitive coupling between the conductor 20 and the integrated circuit 32. In such embodiments the ground plane or a voltage (power) plane in the printed circuit board can be an electric field shield plane that is disposed between the current sensor 30 (or current sensor integrated circuit 32) and the conductor 20 and that reduces the capacitive coupling between the current conductor 20 and the current sensor 30 (or current sensor integrated circuit 32). Alternatively, a layer of conductive material in the printed circuit board 34 can form an electric field shield plane that is independent of a ground or power plane.

In the embodiments of FIGS. 1A, 1B, 1C and 1D, the conductor 20 is free-standing and does not require a separate support. In other embodiments, referring to FIGS. 12A, 12B, 1E and 1F, the current-sensor structure 99 comprises a substrate 10 having a substrate surface 12. The substrate 10 can be a printed-circuit board. The electrical conductor 20 is disposed in relation to the substrate surface 12 of the substrate 10. In embodiments the conductor 20 is disposed on, directly on, over, in contact with, for example in direct contact with, or adjacent to a substrate surface 12 or a layer disposed on the substrate 10 or substrate surface 12. In other embodiments the conductor 20 is disposed or embedded in the substrate 10 and the current sensor 30 (or integrated circuit 32) is directly assembled on the substrate surface 12.

Layers disposed on the substrate 10 can be a part of the substrate 10 or provide the substrate surface 12. In embodiments the conductor 20 is over or adjacent to the substrate 10 but is not in direct contact with the substrate 10. The conductor 20 can have a conductor surface 22 on a side of the conductor 20 opposite the substrate 10. Layers disposed on the conductor 20 or conductor surface 22 can be a part of the conductor 20 or provide the conductor surface 22. The conductor surface 22 can be a plane or in a plane. In other embodiments the conductor surface 22 is not planar.

Referring to FIGS. 11A, 11B, 12A and 12B a current sensor 30 can be centred or disposed on a centre 26 of the conductor 20, for example a centre axial line along the length L of the conductor 20, so that it is not offset from the centre of the conductor 20. Disposing the current sensor 30 in this location can increase the direct current (DC) average response of the current sensor 30 to a current flowing in the conductor 20 and simplify construction. A current sensor 30 is not offset so long as the current sensor 30 is disposed on the centre 26 of the conductor 20 within manufacturing alignment or placement tolerances or is not intentionally disposed offset with respect to the centre 26 of the conductor 20. A current sensor 30 can be disposed on the centre 26 of the conductor 20 if (i) the current sensor 30 centre, (ii) a centre of a sensing element in the current sensor 30 (such as the integrated circuit 32) or (iii) a sensing element within the integrated circuit 32 that performs the sensing is disposed on the conductor centre 26 within manufacturing alignment or placement tolerances.

The conductor 20 can have a length L, a width W and a thickness T (e.g., height or depth). The length L can be greater than the width W, the width W can be greater than the thickness T and the offset direction 28 can be the width direction W. The length L can be in the current direction 24. Typically, a conductor 20 connects one electrical element to another electrical element in the direction L, for example in an HEV-EV three-phase motor control, on an automobile power distribution bus, a battery monitoring system or in a printed circuit board 34 (FIG. 12B). The width W and thickness T can be selected to provide the desired conductivity of the conductor 20 material. In embodiments of the present invention the length L is much greater than the width W, for example the length L is at least twice the width W, the length L is at least five times the width W, the length L is at least ten times the width W or the length L is at least twenty times the width W.

Referring to embodiments of the present invention illustrated in FIGS. 1A-1F, the current sensor 30 is offset a distance O from a centre 26 of the conductor 20 in an offset direction 28 orthogonal to the current direction 24 and parallel to the conductor surface 22 and optionally parallel to the substrate surface 12, if present. The current sensor 30 is offset from the centre 26 of the conductor 20 (O is greater than zero) if a centre of the current sensor 30, a centre of a printed circuit board 34, a centre of an integrated circuit 32 or a centre of another sensing element of the current sensor 30, is offset in the offset direction 28 from the centre 26 (e.g., centre line) of the conductor 20 within manufacturing alignment or placement tolerances. In an embodiment no portion of the current sensor 30 overlaps with the conductor centre 26. A cross section of the conductor 20 taken in the width W direction orthogonal to the current direction 26 and the length L direction can correspond to a transverse cut of the conductor 26 with respect to an axial direction of the conductor 20. The offset direction 28 can be, but is not necessarily, parallel to a conductor surface 22 (the conductor surface 22 need not be planar).

In embodiments of the present invention the current sensor 30 can be offset by an offset distance O equal to or greater than one third, one quarter or one sixth of the current sensor 30 width or length. Where the current sensor 30 comprises a printed circuit board 34 or integrated circuit 32, the current sensor 30 offset distance O can be a distance equal to or greater than the width or length of the printed circuit board 34 or integrated circuit 32. In other embodiments the current sensor 30 offset distance O can be a distance equal to or greater than one sixth, one quarter, one third or one half of the width or length of the printed circuit board 34 or integrated circuit 32. In other embodiments the current sensor 30 can be offset by an offset distance O equal to or greater than the current sensor 30 width or length or one sixth, one quarter, one third or one half of the current sensor 30 width or length.

In some embodiments the conductor 20 has an edge E and the current sensor 30 edge or centre is aligned with the edge E of the conductor 20 (as shown in FIGS. 1A and 1B). The edge E of the conductor 20 can be rounded or curved. In other embodiments the conductor 20 has a width W and the current sensor 30 centre or edge is within a distance of W/5, W/2.5 or 2 W (two times W) or less of the conductor edge E. In other embodiments the current sensor can be disposed an offset distance O in the offset direction from the centre of the conductor that is greater than or equal to W/2, W/3, W/4, W/5 or W/6. Alignment can be within manufacturing or placement tolerances.

In some other embodiments where the current sensor 30 comprises a printed circuit board 34, integrated circuit 32 or sensing element, the printed circuit board 34, the integrated circuit 32 or sensing element of the current sensor 30 is aligned with the edge E. In yet another embodiment the current sensor 30 overhangs the edge E of conductor 20. Alignment can be within manufacturing or placement tolerances.

Figure 1E:
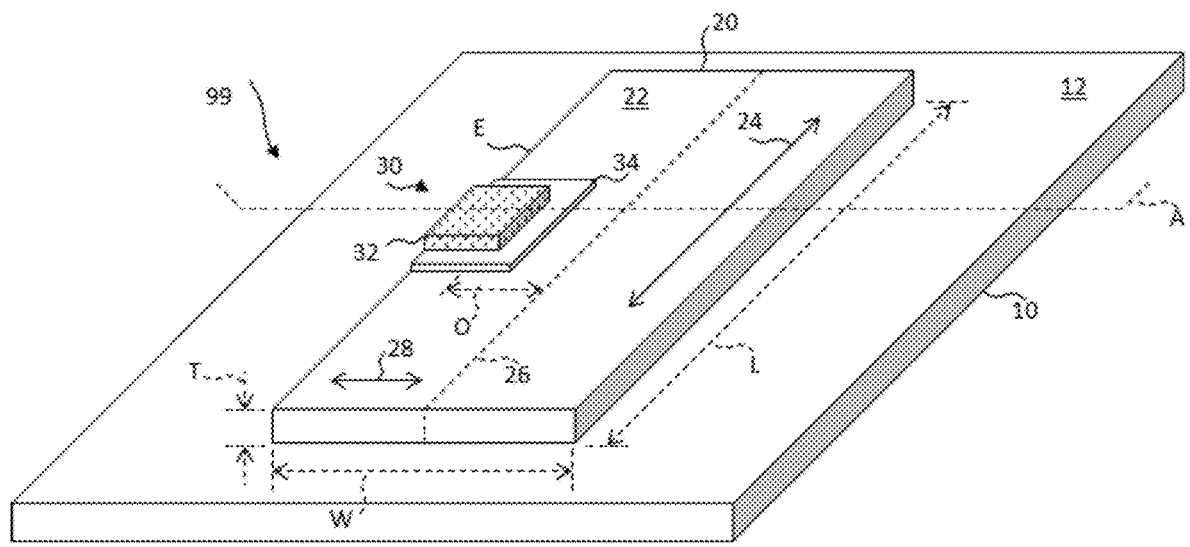
FIG. 1E is a perspective of an illustrative embodiment of the present invention including a support substrate.
Figure 1F:
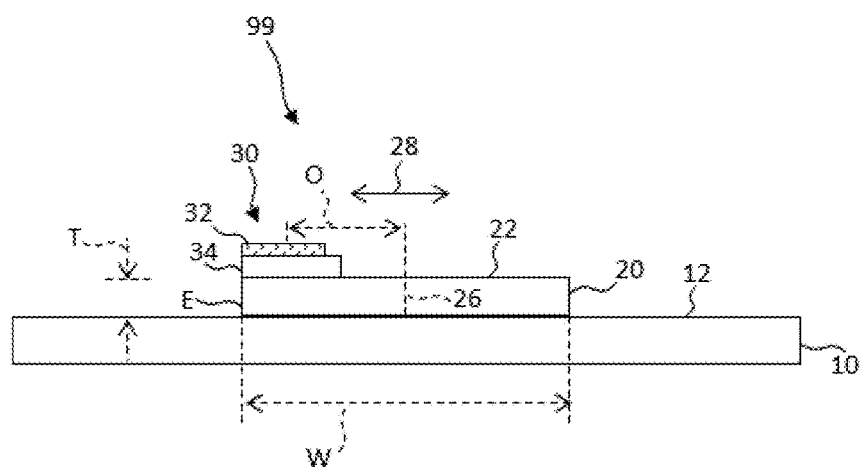
FIG. 1F is a cross section taken across cross section line A of FIG. 1D.
Figure 2A:
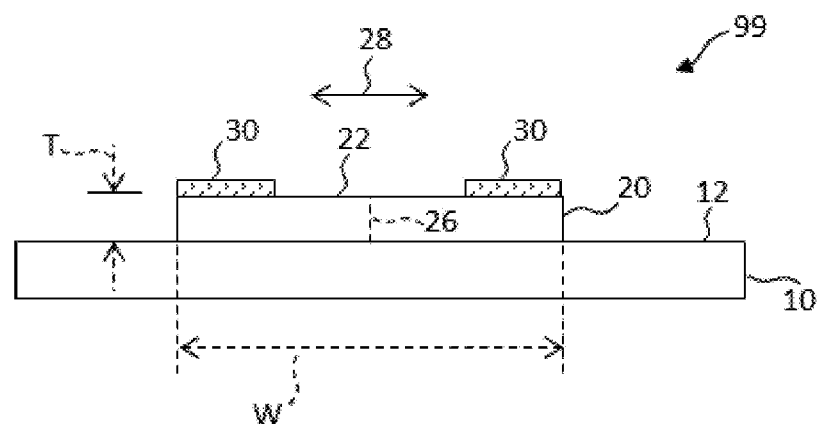
FIGS. 2A-2E are cross sections of illustrative embodiments of the present invention comprising one or more current sensors.
Figure 2B:
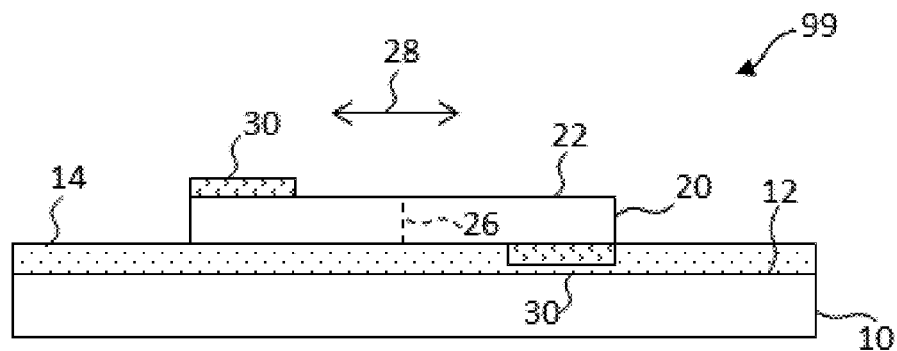

In embodiments of the present invention the current-sensor structure 99 comprises a plurality of current sensors 30. The plurality of current sensors 30 can be integrated into a single chip, a single integrated circuit or a single package. Each current sensor 30 of the plurality of current sensors 30 can be offset a distance O from a centre 26 of the conductor 20 in an offset direction 28 orthogonal to the current direction 24 and parallel to the substrate surface 12 (if the substrate 10 is present, as shown in FIGS. 1E and 1F) or to the conductor surface 22. Referring to FIG. 2A, a first current sensor 30 of the plurality of current sensors 30 and a second current sensor 30 of the plurality of current sensors 30 are disposed on a same side of the conductor 20, for example on a conductor surface 22 of the conductor 20 opposite the substrate surface 12 and in a line parallel to the substrate surface 12. Referring to FIG. 2B, a first current sensor 30 of the plurality of current sensors 30 is disposed on a first side or conductor surface 22 of the conductor 20 and a second current sensor 30 of the plurality of current sensors 30 is disposed on a second side or conductor surface 22 of the conductor 20 opposite the first side or conductor surface 22. As shown in FIG. 2B, one of the two current sensors 30 is disposed on a side or conductor surface 22 of the conductor 20. In embodiments in which the substrate 10 is present, one of the two current sensors 30 can be disposed adjacent to the substrate surface 12 and the other of the two current sensors 30 can be disposed on a side or conductor surface 22 of the conductor 20 opposite the substrate surface 12. In some embodiments the plurality of current sensors 30 are placed symmetrically with respect to the conductor centre 26.

Figure 2C:
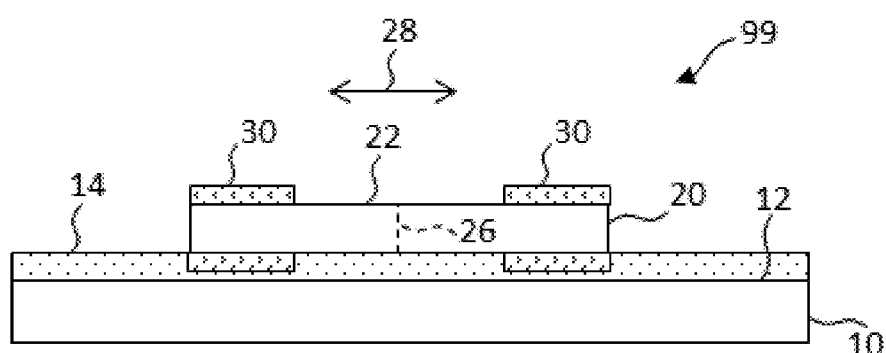

The conductor 20 can be adhered to the substrate 10 (if present) with an adhesive layer 14 and a current sensor 30 can be embedded in the adhesive layer 14. As shown in FIG. 2B, the first and second current sensors 30 can also be disposed on opposite sides of the conductor 20 in the offset direction 28 (the width direction W). Referring to FIG. 2C, four current sensors 30 can be disposed on the conductor 20, two current sensors 30 on each side or conductor surface 22 of the conductor 20 in the offset direction 28. There are also two current sensors 30 on a side of the conductor 20 adjacent to the substrate surface 12 (for example embedded in an adhesive layer 14) and two current sensors 30 on a side or conductor surface 22 of the conductor 20 opposite the substrate surface 12.

Figure 2D:
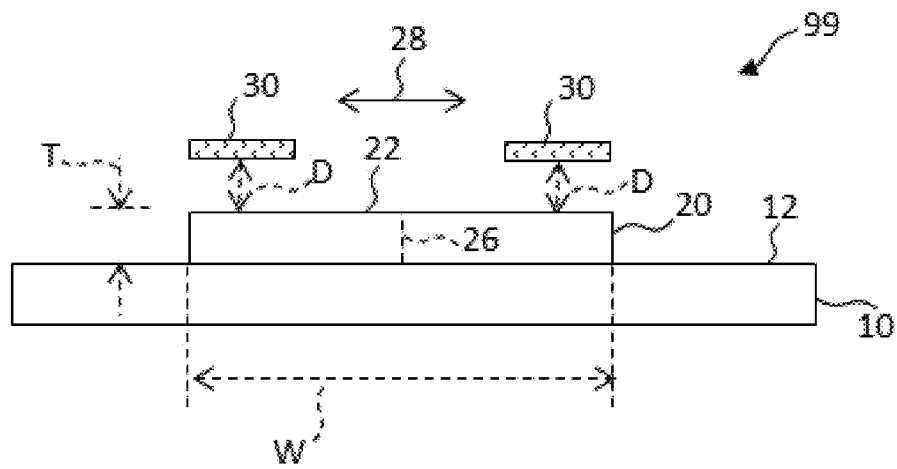
Figure 2E:
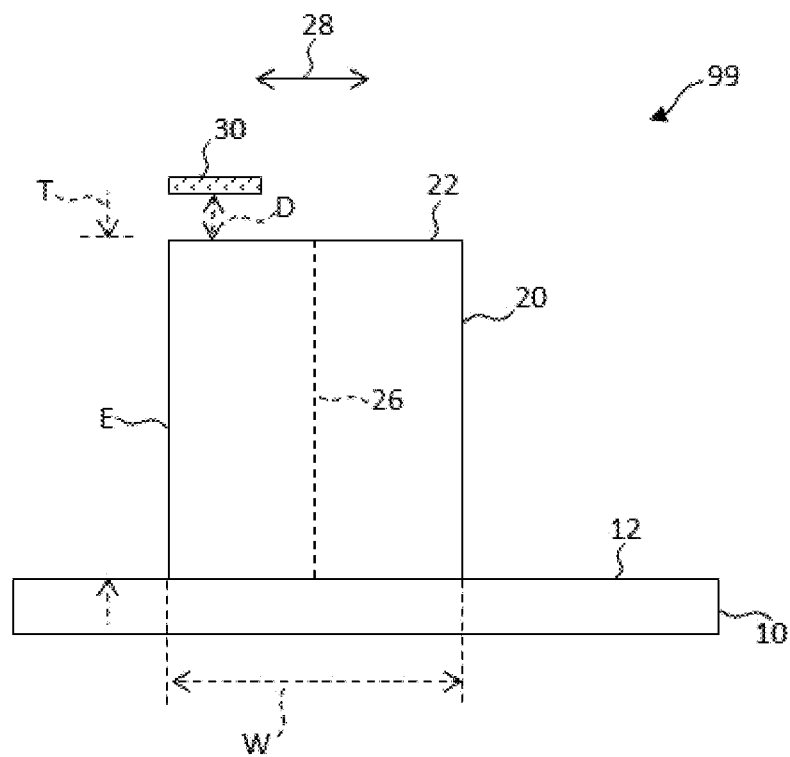

In some embodiments of the present invention, referring to FIGS. 2D (with two current sensors 30 and a relatively thin conductor 20) and 2E (with one current sensor 30 and a relatively thick conductor 20), any one or all of the current sensors 30 are distant from the conductor 20 by a removal distance D (i.e. the one or more current sensors 30 are distant or offset away from the conductor 30 in a direction orthogonal to the conductor surface 12 to which the current sensors 30 are closest by a removal distance D). For example, the printed circuit board 34 on which the integrated circuit 32 is disposed can have a thickness D so that the integrated circuit 32 is not in contact with the conductor 20. Alternatively, in embodiments of the present invention, the entire current sensor 30 is distant from the conductor 20 by the removal distance D, as shown in FIGS. 2D and 2E.

This removal distance D can be less than the width W for a relatively thin conductor 20, for example W can be at least two times, five times, ten times, twenty times or fifty times greater than the removal distance D. In other embodiments comprising a relatively thick conductor 20, the removal distance D can be greater than the width of the conductor 20.

In other embodiments any one or combination of current sensors 30 can comprise two or more sensor elements in a monolithic current sensor 30. The two or more sensor elements can be spatially offset and can be operated to sense a differential field, such as a differential magnetic field.

As shown in FIGS. 2A-2D, the current sensor 30 has a width W that is greater than the thickness T. In some configurations the conductor 20 has a top surface area (for example corresponding to the area of the conductor 20 in the width W and length L directions such as the conductor surface 22) and a side surface area (for example corresponding to the area of the conductor 20 in the thickness T and length L directions). The side surface area is smaller than the top surface area and the first current sensor 30 and the second current sensor 30 are both disposed in a line or plane parallel to the top surface. Alternatively, the first current sensor 30 and the second current sensor 30 are both disposed in a line or plane parallel to the side surface.

Figure 3A:
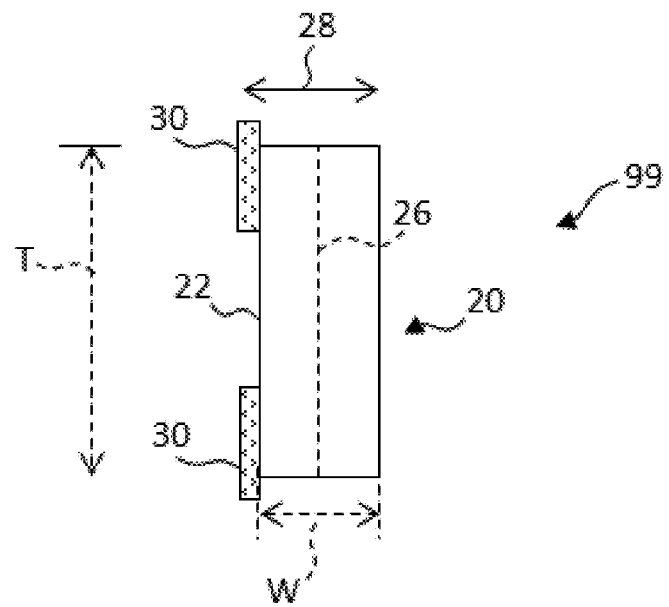
FIGS. 3A-3E are cross sections of illustrative embodiments of the present invention comprising a plurality of current sensors.
Figure 3B:
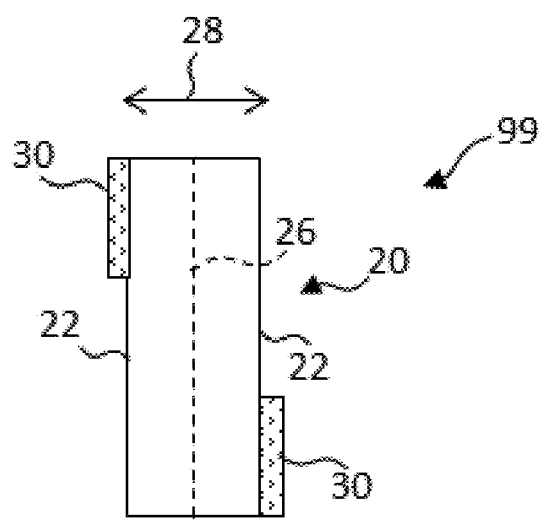
Figure 3C:
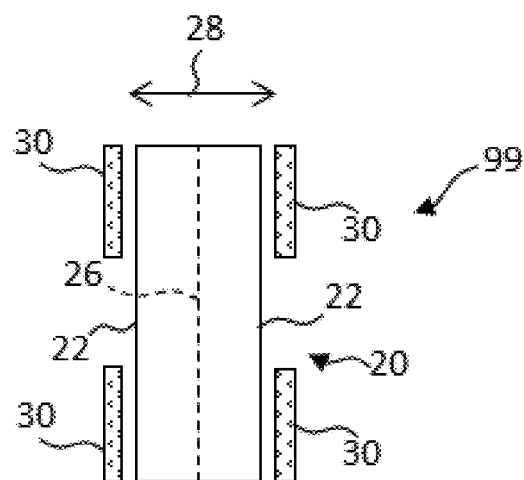

In alternative embodiments, as shown in FIG. 2E and referring to FIG. 3A, the current sensor 30 has a width W that is less than the thickness T. As shown in FIG. 3A, a first current sensor 30 of the plurality of current sensors 30 and a second current sensor 30 of the plurality of current sensors 30 are disposed on a same side or conductor surface 22 of the conductor 20, for example both are disposed in a line orthogonal to the substrate surface 12. Referring to FIG. 3B, a first current sensor 30 of the plurality of current sensors 30 is disposed on a first side or conductor surface 22 of the conductor 20 and a second current sensor 30 of the plurality of current sensors 30 is disposed on a second side or conductor surface 22 of the conductor 20 opposite the first side. The conductor 20 can, but does not necessarily have a rectangular cross section orthogonal to its length L. Referring to FIG. 3C, four current sensors 30 can be disposed on the conductor 20, two current sensors 30 on each side or conductor surface 22 of the conductor 20 in the offset direction 28.

Figure 3D:
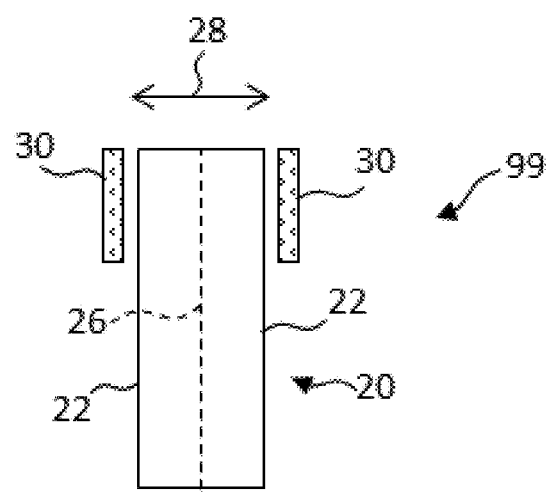

Referring to FIG. 3D, two current sensors 30 are disposed directly opposite each other on opposite sides of the conductor 20. In such an arrangement, the current-sensor structure 99 can be operated in a differential way such that the signals from the two current sensors 30 can be subtracted to cancel out external magnetic fields and thereby improve the signal-to-noise ratio of the current-sensor structure 99. For example, a first sensor 30a can measure $V_a = B_{ext} + B_{current}$ and $V_b = B_{current} - B_{ext}$ so that $V_a + V_b = 2 \times B_{current}$. Such an embodiment can reduce the need for a shield 40. As shown in FIGS. 3A-3D, the first and second sides 22 are orthogonal to the substrate surface 12, but other angles are possible and are included in the present invention, for example the conductor 20 can have a trapezoidal cross section.

In various embodiments of the present invention the current sensor 30 can be disposed on a surface of the conductor 20 and aligned with an edge of the conductor 20, as shown in FIG. 3B. In other embodiments, referring to FIG. 3A, the current sensor 30 can be disposed on a surface of the conductor 20 and extend over an edge of the conductor 20, as shown, or set back from an edge (not shown in FIGS. 3A-3D). Referring to FIGS. 3C and 3D, the current sensor 30 can be disposed so that the current sensor 30 is not in contact with a surface of the conductor 20, but is spatially separated from the conductor 20 by a gap.

Figure 3E:
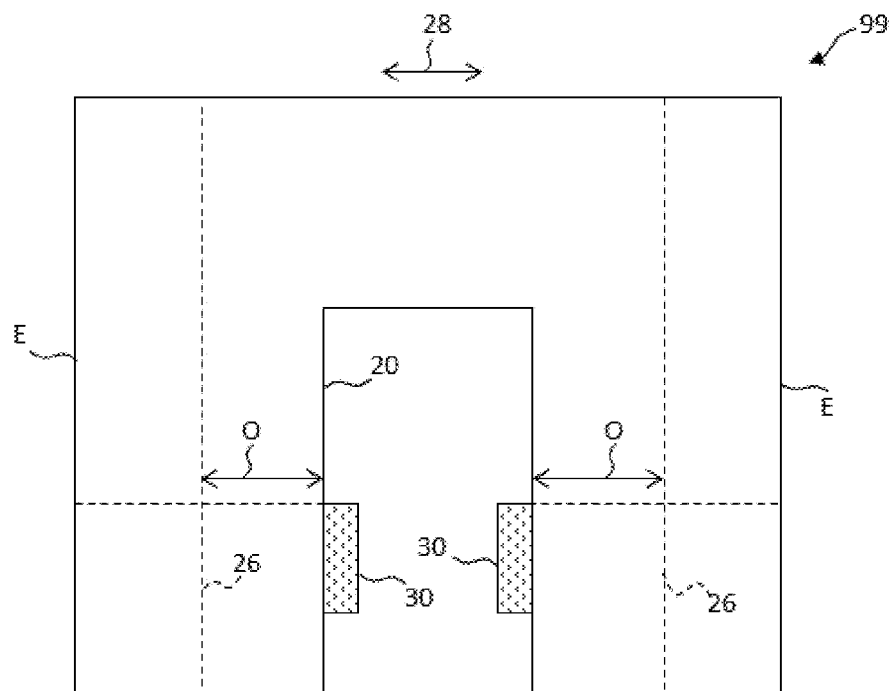

Referring to FIG. 3E, in some embodiments the current conductor 20 has a U-shape with two legs extending in a cross-sectional direction orthogonal to the direction 24 of current flow (the direction 24 of current flow is shown in FIG. 1A). At least two current sensors 30 are disposed in relation to the conductor 20 to measure the magnetic field generated by the electrical current in different or opposite directions and to measure an external magnetic field in the same direction. For example, two current sensors 30 are disposed symmetrically on the two different legs of the conductor 20 so that the current sensors 30 are sensing the same current flowing in relatively opposite directions but sense the same external field in the same orientation. In this case the conductor centre 26 of the conductor 20 for each current sensor 30 is the centre of each leg through which the flowing current is measured. In such an arrangement the current-sensor structure 99 can be operated differentially such that the signals from the two current sensors 30 can be subtracted to cancel out any external magnetic fields. For example, a first current sensor 30 can measure $V_a=B_{ext}+B_{current}$ and a second current sensor 30 can measure $V_b=B_{ext}-B_{current}$ so that $V_a-V_b=2\times B_{current}$. The relative signs of $V_a$ and $V_b$ are expressed in local sensor coordinates. Thus, at least two current sensors 30 of the plurality of current sensors 30 are disposed on the conductor 20 to measure the same current magnetic field amplitude in different directions, so that the contribution of an external magnetic field with respect to the sensed current-generated magnetic field measured by the at least two current sensors 30 can be cancelled by a combination of the two current-sensor measurements. In some embodiments the two current sensors 30 are on a common side of the conductor 20 (for example on different arms of a U-shaped conductor 20). In other embodiments the two current sensors 30 are on different side of the same conductor 20 (for example as shown in FIG. 3D).

In other embodiments of the present invention the current-sensor structure 99 comprises two or three or more conductors 20, each conductor 20 having a current sensor 30 and extending in a direction, and the directions are parallel.

Figure 4:
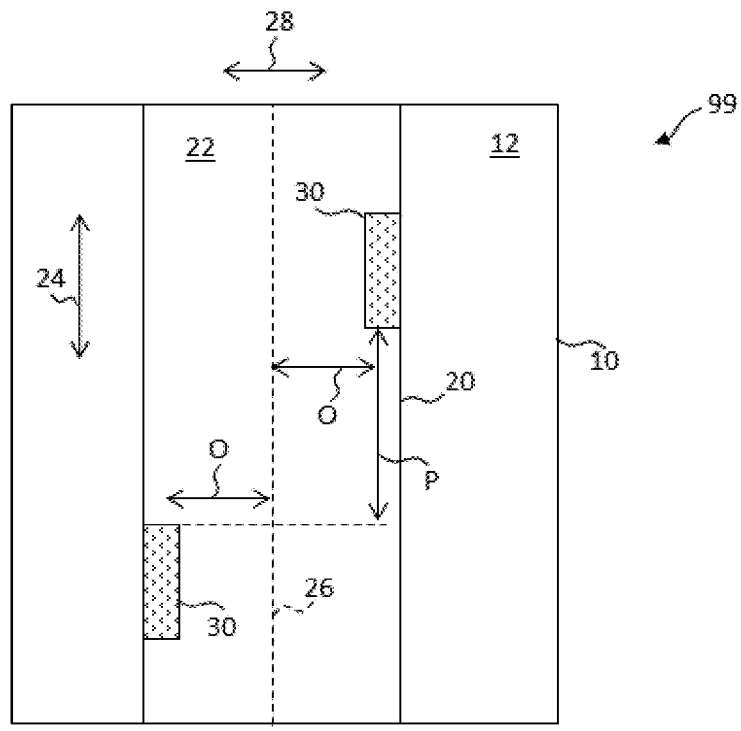
FIG. 4 is a plan view of an illustrative embodiment of the present invention having current sensors offset in the current direction.

In some embodiments two or more current sensors 30 are disposed in a line or plane orthogonal to the conductor surface 22 or to the substrate surface 12 (e.g., as shown in FIGS. 2C, 3A, 3B and 3C, if present). In other embodiments, referring to FIGS. 2A, 2B, 2C and 3C, the first current sensor 30 and the second current sensor 30 are both disposed in a line or plane parallel to the conductor surface 22 or to the substrate surface 12, if present. In a further embodiment, illustrated in FIG. 4, a first current sensor 30 and a second current sensor 30 are offset a distance P in the current direction 24.

Figure 5A:
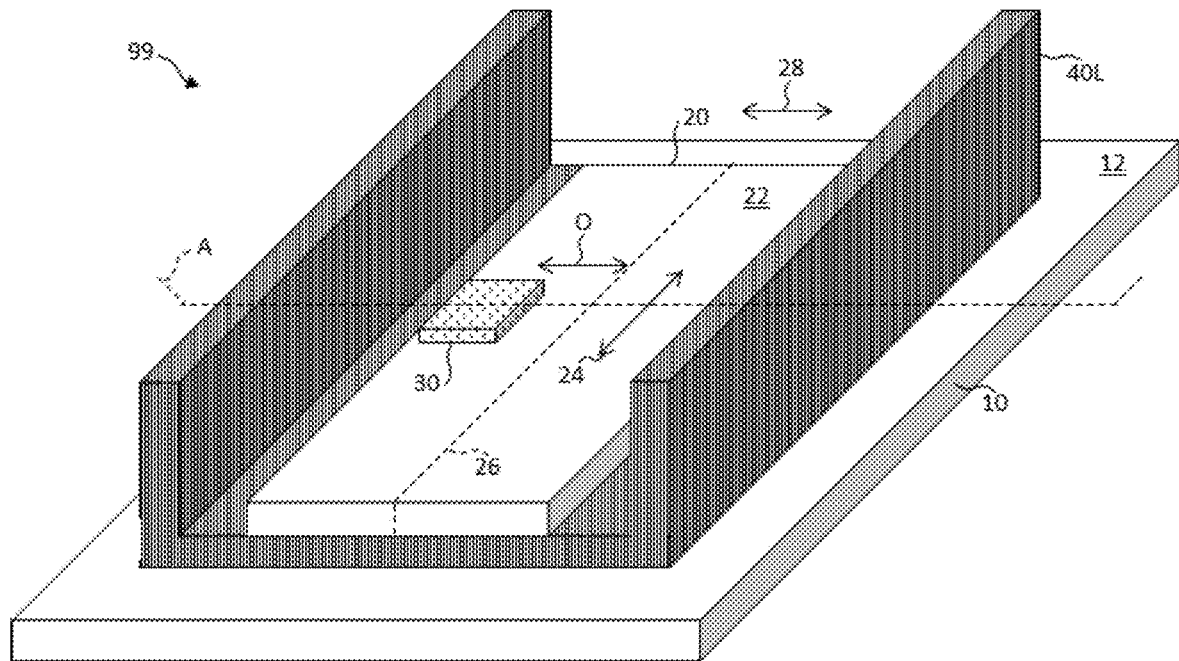
FIG. 5A is a perspective of an illustrative embodiment of the present invention comprising a laminated shield.
Figure 5B:
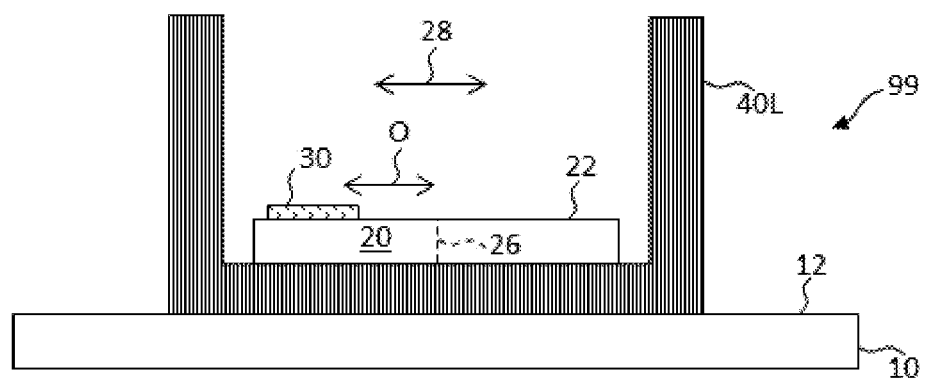
FIG. 5B is a cross section taken across cross section line A of FIG. 5A.

Referring to FIGS. 5A and 5B and to FIGS. 12A and 12B, the current-sensor structure 99 comprises a shield 40 (FIGS. 12A and 12B) or laminated shield 40L (FIGS. 5A and 5B), collectively shield 40, for example a magnetic shield 40 for protecting the current sensor 30 from stray or external magnetic fields. The sizing of the shield 40 is done in a way to avoid magnetic saturation within the desired current sensing range. The shield 40 also provides a magnetic concentration function in addition to its primary function of stray field shielding. The shield 40 at least partially surrounds the conductor 20 and the current sensor 30 and can be disposed on the conductor 20, conductor surface 22, substrate 10 or a surface 12 of the substrate 10, or on layers or structures provided on the conductor 20, conductor surface 22, substrate 10 or the substrate surface 12. In other embodiments the electrical conductor 20 (e.g., a bus-bar, trace or wire) can be disposed in, on or over the shield 40, or on a layer disposed on the shield 40 with or without a substrate 10, for example electrical conductor 20 is in contact with an insulating layer provided on the shield 40 or the shield 40 is in contact with an insulating layer provided on the electrical conductor 20.

A cross section of the shield 40 in a direction orthogonal to the current direction 24 and the substrate surface 12 can form a U-shape with the vertical portions of the U-shape with respect to the substrate surface 12 disposed on either side of the conductor 20 parallel to the current direction 24 and orthogonal to the substrate surface 12. The electrical conductor 20 can pass along the bottom portion of the U-shape within the shield 40, as shown in FIG. 5A. In FIGS. 12A and 12B, the current sensor 30 is disposed at the centre 26 of the conductor 20 and equidistant from the vertical sides of the shield 40 U-shape. In FIGS. 5A and 5B the current sensor 30 is disposed offset a distance O from the centre 26 of the conductor 20 and closer to one side of the shield 40 U-shape (vertical portions) than the other.

Figure 5C:
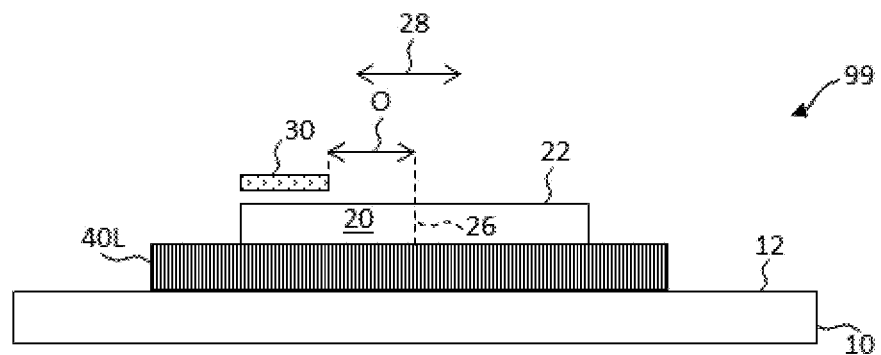
Figure 5D:
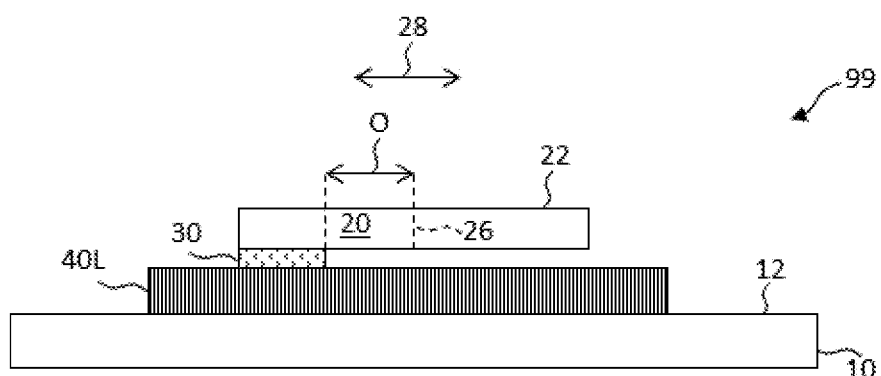
Figure 5E:
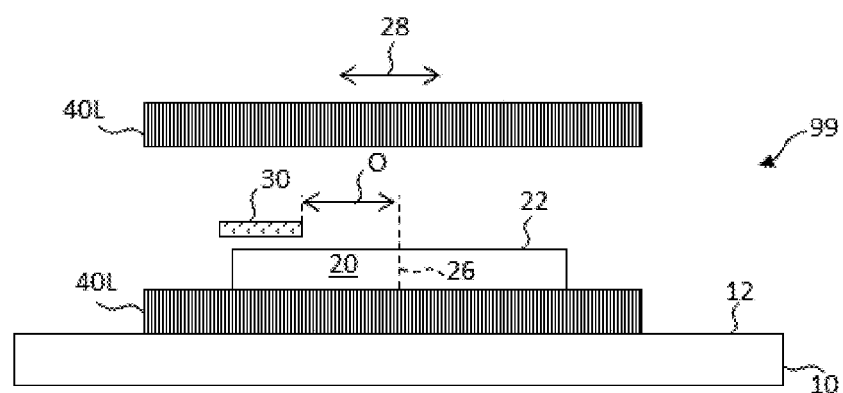

In other embodiments, referring to FIGS. 5C-5E, the shield 40L (or 40, not shown in FIGS. 5C-5E) does not have a U-shape and can, for example, have a rectangular cross section with a surface planar to the width and length of the conductor 20. As shown in FIG. 5C, the conductor 20 is between the shield 40L and the current sensor 30. Referring to FIG. 5D, the current sensor 30 is between the shield 40L and the conductor 20. FIG. 5E illustrates an embodiment with two shields 40L (or alternatively one shield 40L with two portions, each of which has a rectangular cross section) one on each side of the conductor 20 with the current sensor 30 between the two shields 40L (or two rectangular portions). Thus, the shield 40 can comprise a plane or two parallel planes. Such shield 40L arrangements or structures can have a reduced form factor, for example it can be flatter, than a U-shaped shield 40L. As intended herein, a single rectangular shield 40 adjacent to a current sensor 30 is considered to at least partially surround the current sensor 30.

Figure 5H:
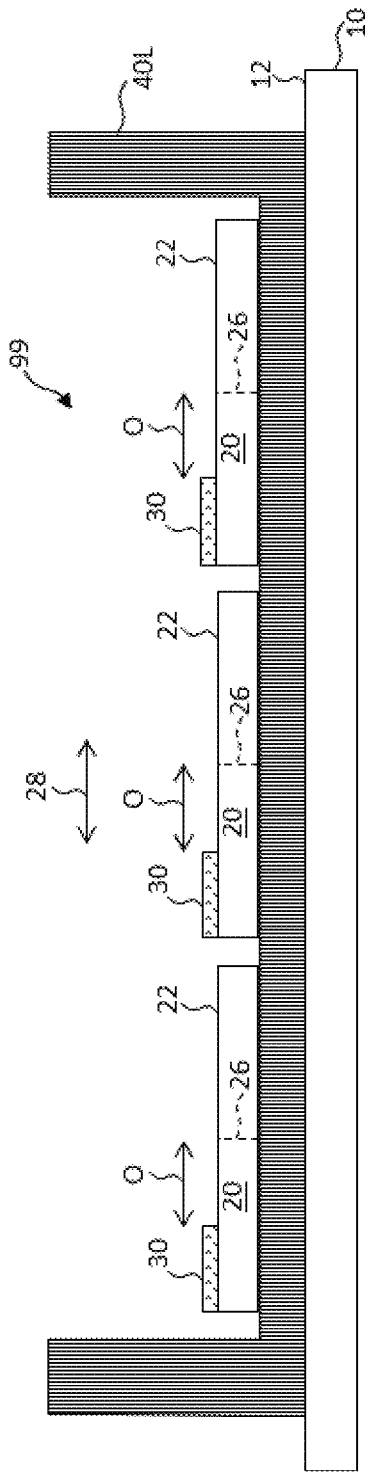
Figure 5I:
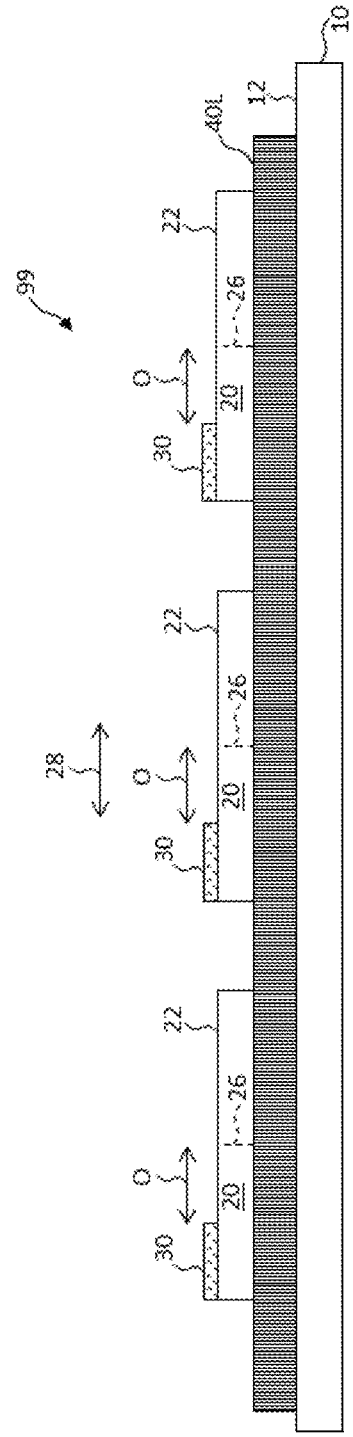
Figure 5J:
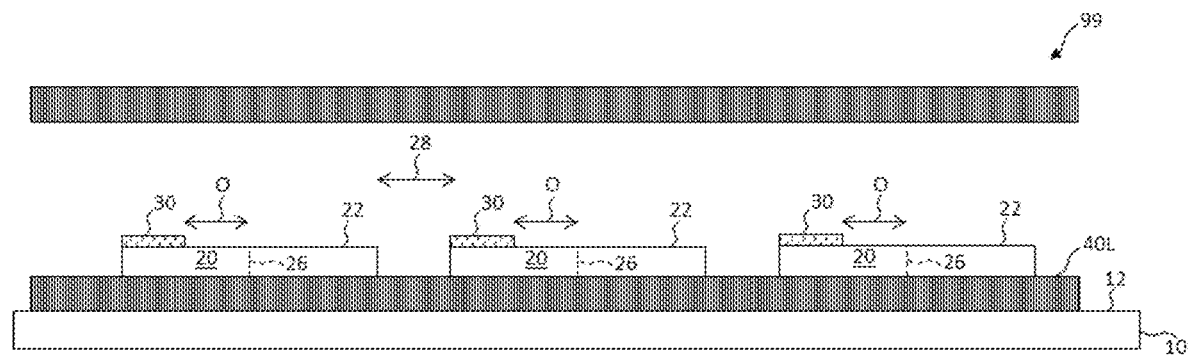

Referring to FIGS. 5F-5J, embodiments of the present invention can be applied to three-phase alternating current electronic systems in which the current and voltage can be out of phase in each of three electrical conductors, for example three separate conductors 20, each conductor 20 having a separate current sensor 30. Each of the three conductors 20 can be disposed within a separate shield 40L and optionally provided on a common substrate 10, as shown in FIG. 5F. In other embodiments, as shown in FIG. 5G, a single shield 40L can have multiple vertical portions that separate each of the conductors 20 and their corresponding current sensor 30. As shown in FIG. 5H, vertical portions of the shield 40L are provided only external to all of the conductors 20 and current sensors 30. Referring to FIG. 5I, the vertical portions are not present, for example similar to FIG. 5C or 5D. FIG. 5J illustrates embodiments having two rectangular shields 40L, one beneath all of the conductors 20 and current sensors 30 and one above all of the conductors 20 and current sensors 30. The different shield 40L embodiments for three-phase systems of the present invention can have different material, construction and assembly costs and can be selected for different systems having different requirements.

In an embodiment and as also shown in FIGS. 5F-5J, the current-sensor structure comprises three or more conductors 20. Each conductor 20 of the three or more conductors 20 has a longest length dimension that extends in a similar, parallel direction and conducts a different phase of a three-phase current. Each conductor 20 of the three or more conductors 20 has at least one current sensor 30 (as shown in FIGS. 5F-5J) or has at least two current sensors 30 (as shown in FIGS. 2A-2E, 3A-3E and 4). In other embodiments only two conductors 20 of the three or more conductors 20 have at least one current sensor 30 or have at least two current sensors 30.

Referring to FIGS. 5A-5D, the current sensor 30 can be disposed in a variety of spatial relationships with the conductor 20, as is also shown in FIGS. 3A-3D. As shown in FIGS. 5A and 5B, the current sensor 30 can be disposed on a surface of the conductor 20 and set back from an edge of the conductor 20, rather than aligned with the edge. In other embodiments, referring to FIG. 5C, the current sensor 30 can be separated from a surface of the conductor 20 by a gap and also be aligned with an edge of the conductor 20. Referring to FIG. 5D, the current sensor 30 is disposed in contact with a surface of the conductor 20 and a shield 40L and aligned with an edge of the conductor 20. In other embodiments the current sensor 30 is disposed between the conductor 20 and the shield 40L but is not in contact with either the conductor 20 or the shield 40L, or both, for example separated by a gap. In any of these embodiments the current sensor 30 can be aligned with an edge of the conductor 20, set back from an edge of the conductor 20 or extend over an edge of the conductor 20, for example as shown in FIGS. 5A, 5B, 5C, and 5E.

The shield 40 can be a single material as shown in FIGS. 12A and 12B. In other embodiments of the present invention the shield 40 can be a laminated shield 40L. The shield 40 can comprise a variety of materials, for example ferromagnetic materials, SiFe or NiFe. In general, the taller the sides (vertical portions) of the shield 40 U-shape, the more effective the shield 40 is. The shield 40 can comprise layers oriented in a direction parallel to or orthogonal to the current direction 24 or other directions. In some embodiments of the present invention the shield 40 may be connected to a current-sensor structure 99 ground or to any other ground connection. The ground may also be shared with a ground of the current sensor 30.

Figure 6A:
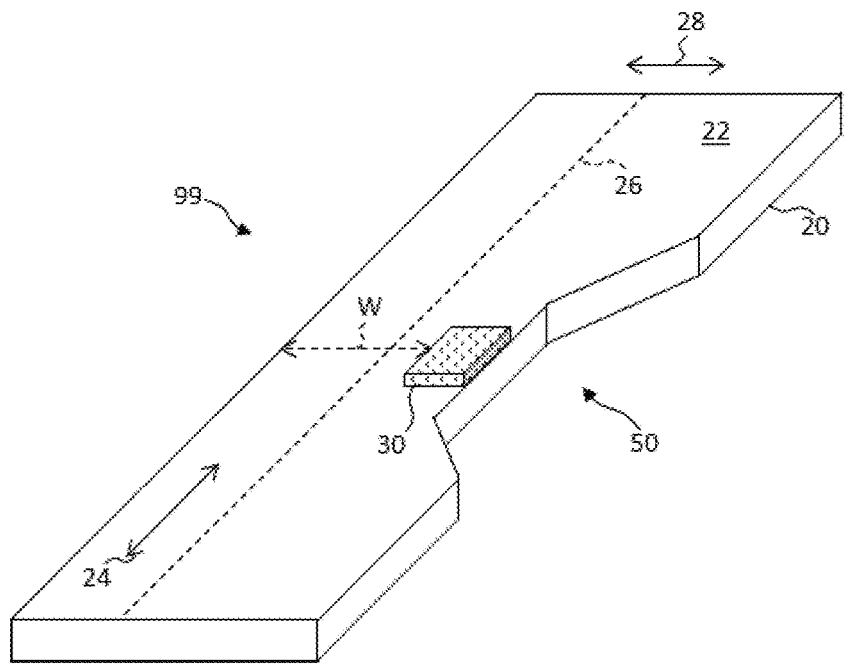
FIG. 6A is a perspective of an illustrative embodiment of the present invention comprising a conductor with a notch.
Figure 6B:
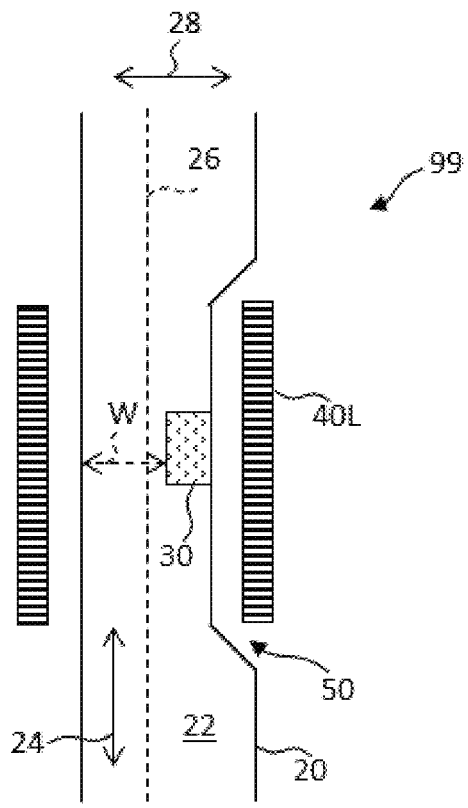
FIG. 6B is a plan view of the embodiment of FIG. 6A including a shield.

Referring to FIGS. 6A and 6B, in embodiments of the present invention the conductor 20 has a notch 50 (i.e. a neck or necked-down portion) formed in a portion of the conductor 20 and the current sensor 30 is disposed adjacent to the notch 50, for example on the conductor surface and offset from the notch in the offset direction 28. The notch 50 forms a portion of the conductor 20 that has a reduced width W in the offset direction 28. In other embodiments a shield 40 is disposed in the notch 50 to reduce the overall width of the current-sensor structure 99 within a larger system (FIG. 6B). For clarity, the shield 40 is not shown in FIG. 6A.

Figure 6C:
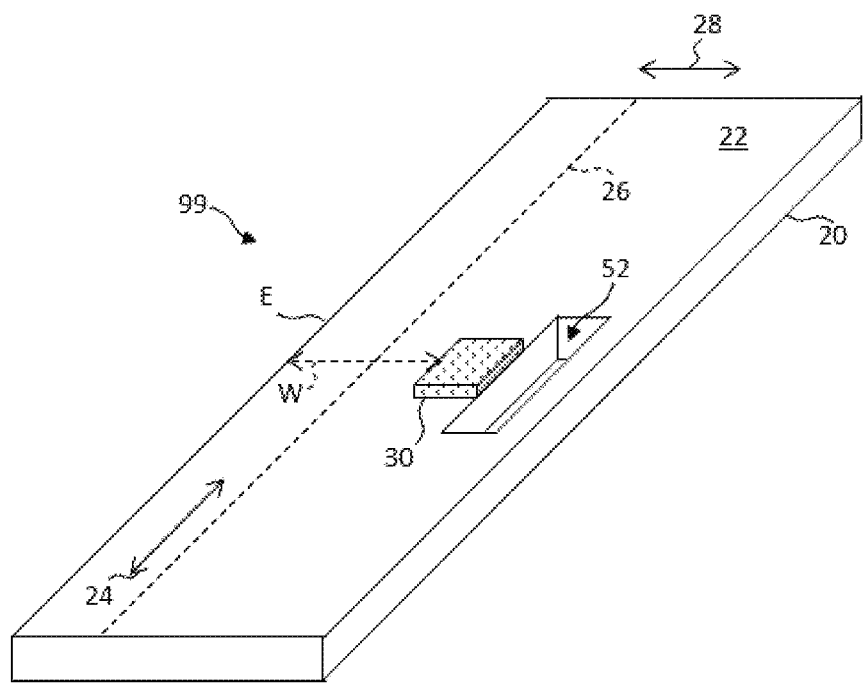
FIG. 6C is a perspective of an illustrative embodiment of the present invention comprising a conductor with a hole or slot.

Referring to FIG. 6C, in embodiments of the present invention the conductor 20 has a hole 52 formed in a portion of the conductor 20 and the current sensor 30 is disposed adjacent to the hole 52, for example on the conductor surface 22 and offset from the conductor centre 26 in the offset direction 28. In this embodiment the conductor centre 26 is located half way between the hole 52 and the edge E of the conductor 20 on the side of the current sensor 30 opposite the hole 52. In other embodiments a shield 40 is disposed at least partially surrounding the conductor 20.

As will be understood by those skilled in the art, embodiments of the present invention comprising a notch 50 are similar to an embodiment comprising a hole 52, since the current density for alternating currents increases at the surface of the conductor 20 as a function of the frequency of the alternating current and therefore providing a hole 52 is equivalent to providing a notch 50 for the local field perceived by the magnetic current sensor 30.

Figure 7:
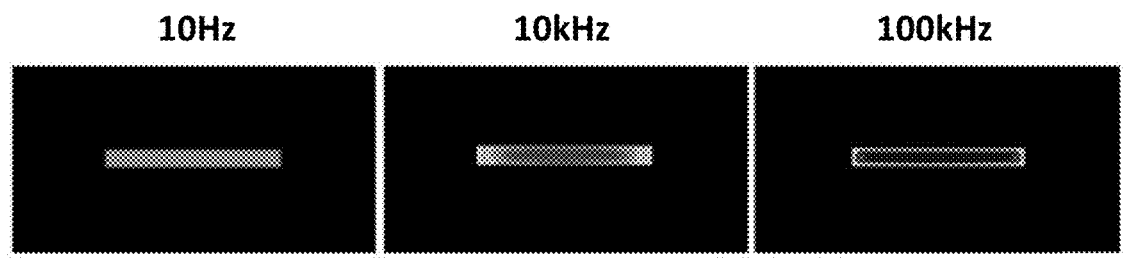
FIG. 7 includes structural and model illustrations of current density in an electrical conductor at different frequencies useful in understanding embodiments of the present invention.
Figure 7:
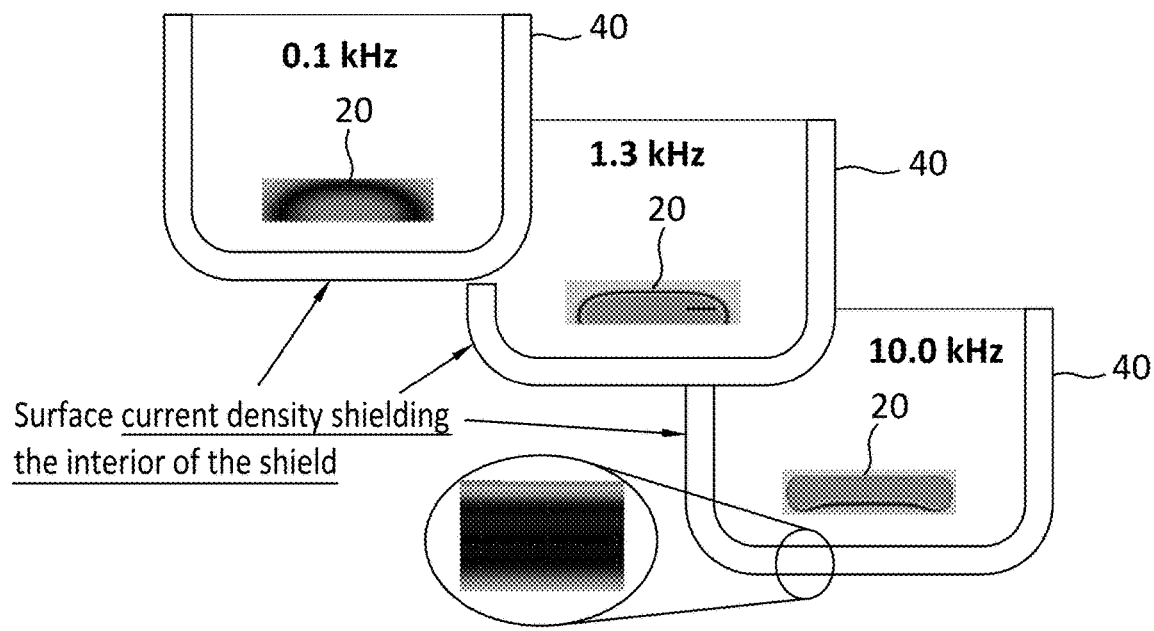

FIG. 7 illustrates a model of current density at various frequencies of alternating current in the conductor 20. As shown in FIG. 7, when the conductor 20 conducts alternating current, eddy currents appear in the conductor 20 and the shield 40. When the frequency increases, the current in the conductor 20 tends to flow on the edge of the conductor 20. This phenomenon is called the skin effect. The skin effect also appears in the shield 40, as shown in the inset of FIG. 7. As a consequence of the skin effect, the magnetic field dispersion 62 over the conductor 20 as well as the phase-shift variation change with respect to frequency and become greater as the frequency increases, as shown in FIG. 8.

Figure 8:
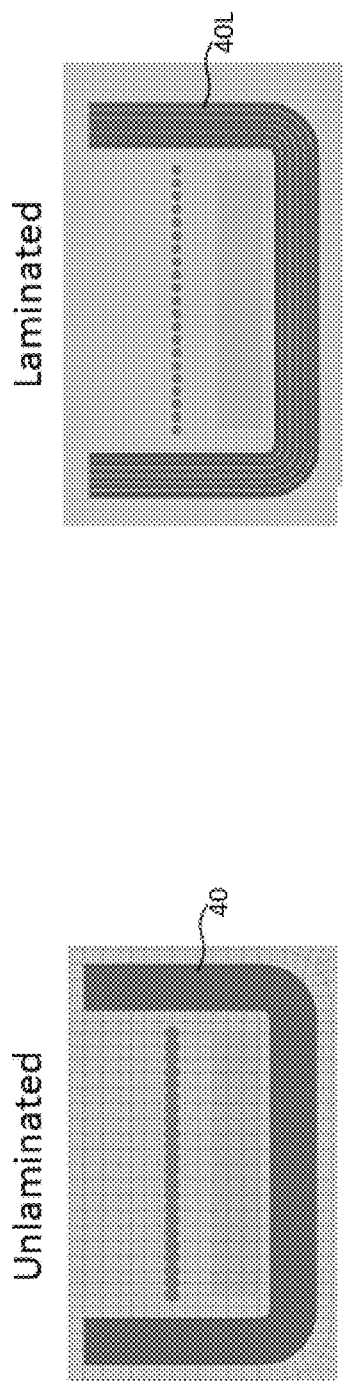
FIG. 8 includes graphs and structural illustrations of magnetic fields and phases in an electrical conductor for various electrical current frequencies according to a behavioural model of electrical currents useful in understanding embodiments of the present invention.
Figure 8:
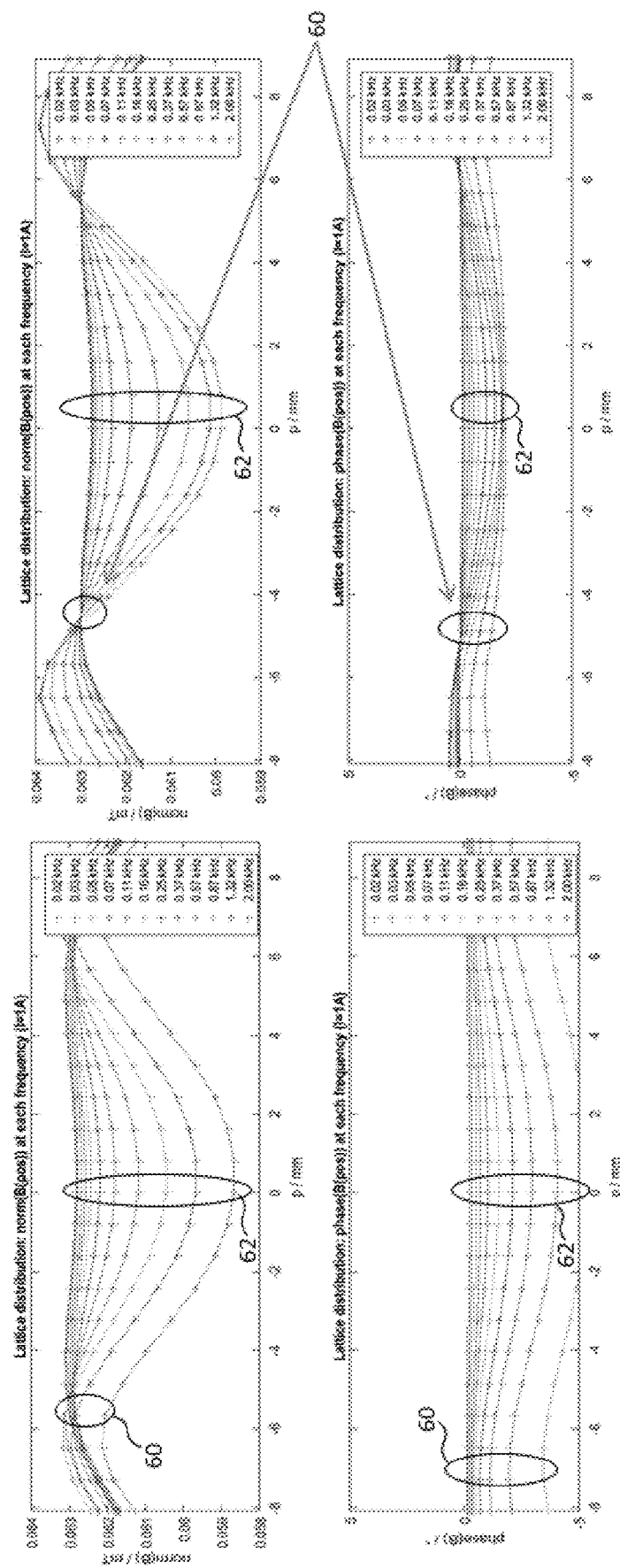

Referring to FIG. 8, at spatial locations or nodes 60 offset from the centre of the conductor 20, the phase shift variation (bottom graphs) and the magnetic gain variation (top graphs) of the magnetic fields due to alternating currents at the centre 26 of the conductor 20, corresponding to the magnetic field/phase dispersion 62, are significantly attenuated and the dispersion of the field due to frequency greatly decrease. The reduction in variation at nodes 60 for unlaminated shields 40 is shown in the left graphs. When the shield 40L is laminated (right graphs), the phase shift variation and magnetic gain variation are further decreased. Thus, by locating the current sensor 30 at the spatial location of the nodes 60 offset from the conductor centre 26 in the offset direction 28, the variation (dispersion) of the magnetic gain and phase are decreased and the current sensor 30 signal response uniformity increased with respect to frequency, especially with a laminated shield 40L.

Figure 9A:
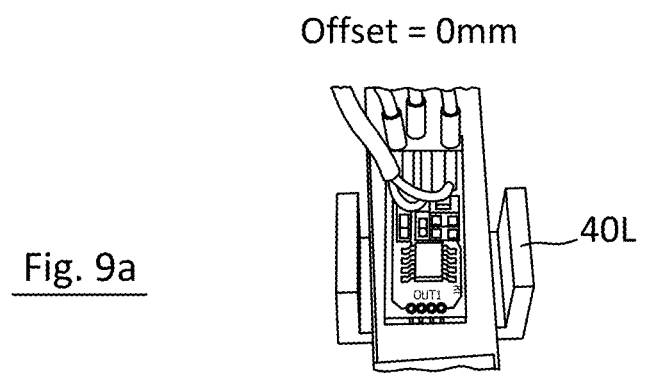
FIGS. 9A and 9B show images of current-sensor structures according to an embodiment of the present invention.
Figure 9B:
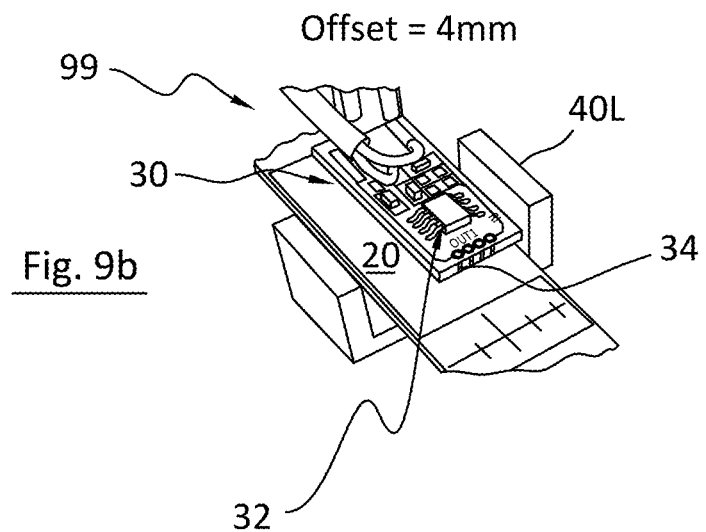

Referring to FIGS. 9A and 9B, a current-sensor structure 99 with a current sensor 30 aligned with the conductor centre 26 is shown in the top image and a current-sensor structure 99 with a sensor 30 offset from the conductor centre 26 is shown in the bottom image; both include a laminated shield 40. The current-sensor structure 99 has been constructed and tested and found to provide reduced variation and dispersion in sensed current measurements as the alternating currents change in frequency.

Figure 10:
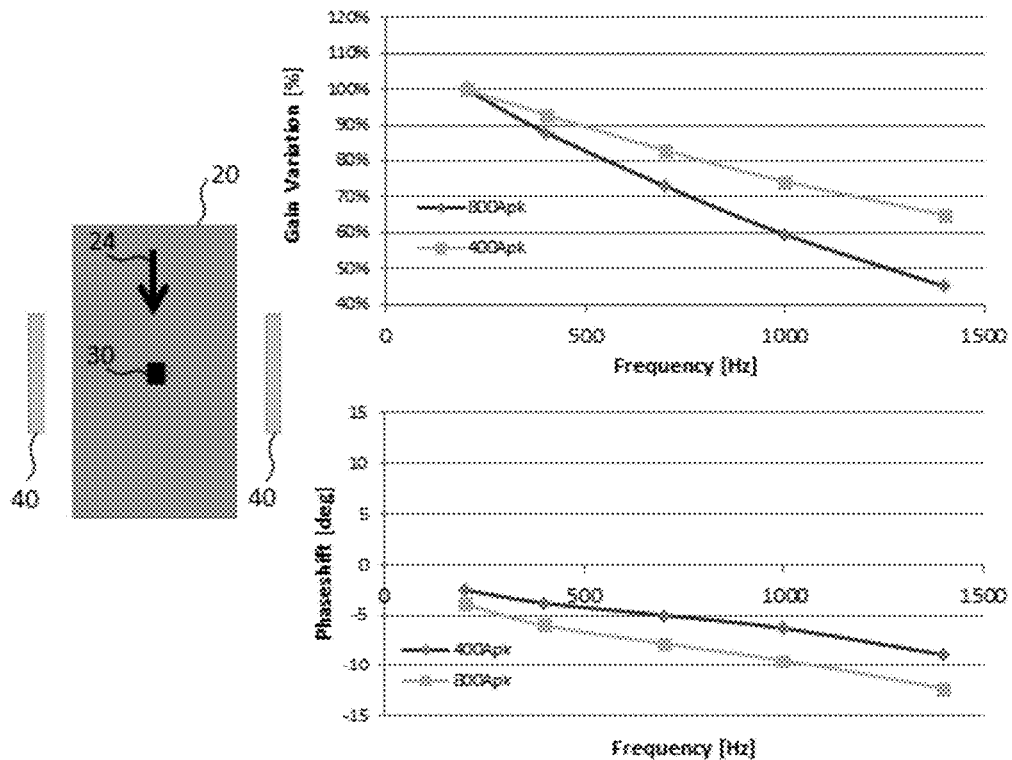
FIG. 10 includes graphs of phase shift and gain variation measurements with respect to electrical current frequency together with illustrations of corresponding current-sensor structures according to embodiments of the present invention.
Figure 10:
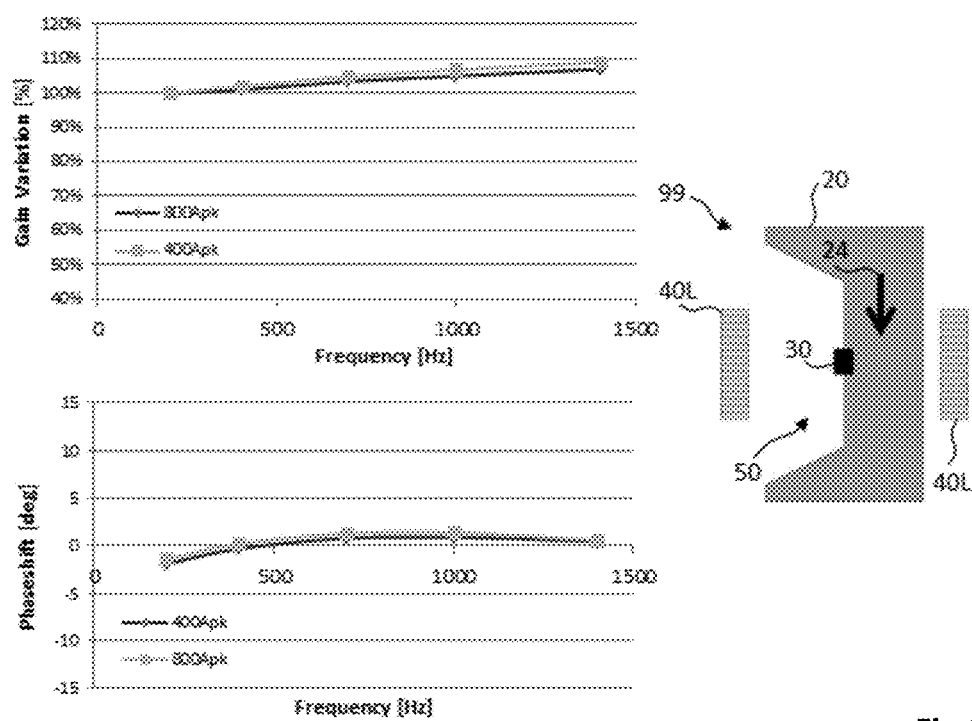
Figure 11A:
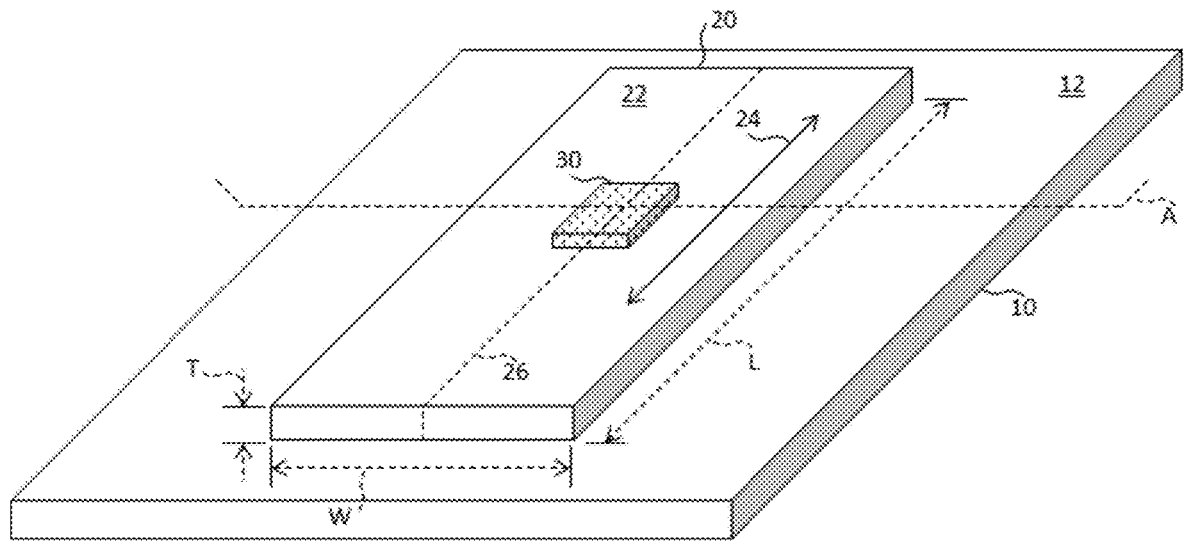
FIG. 11A is a perspective of current-sensor structure useful in understanding embodiments of the present invention.
Figure 11B:
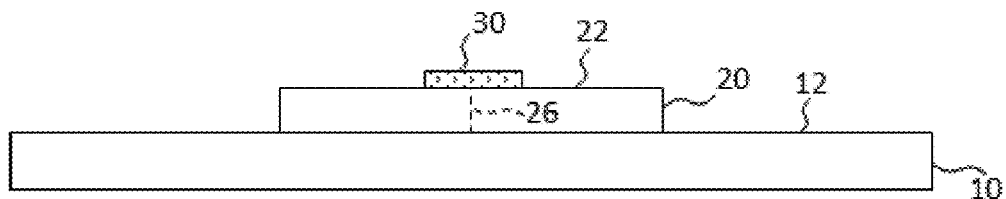
FIG. 11B is a cross section taken across cross section line A of FIG. 11A.

Referring to FIG. 10, the performance of an unlaminated current-sensor structure 99 is compared to the performance of a laminated current-sensor structure 99 with a necked-down conductor 20 portion (notch 50) for both gain and phase shift at various alternating current frequencies and current densities in the conductor 20. As shown by comparing the deviation range between the left and right plots, the variation in gain and phase shift at various alternating current frequencies is reduced for the laminated current sensor structure 99 with the notch 50, demonstrating the performance advantage of embodiments of the present invention. Moreover, the current dependence of the gain and phase shift variation is reduced as demonstrated by the overlapping curves on the right plots for both sets of current points due to the current sensor offset and shield lamination. Corresponding structural diagrams for the two current-sensor structures 99 are shown adjacent to the graphs, and include the conductor 20, the current sensor 30, the current direction 24, shield 40 and notch 50 and laminated shield 40L (on the right side).

While the invention has been illustrated and described in detail in the drawings and foregoing description, such illustration and description are to be considered illustrative or exemplary and not restrictive. The foregoing description details certain embodiments of the invention. It will be appreciated, however, that no matter how detailed the foregoing appears in text, the invention may be practiced in many ways. The invention is not limited to the disclosed embodiments.

Other variations to the disclosed embodiments can be understood and effected by those skilled in the art in practicing the claimed invention, from a study of the drawings, the disclosure and the appended claims. In the claims, the word "comprising" does not exclude other elements or steps, and the indefinite article "a" or "an" does not exclude a plurality. A single processor or other unit may fulfil the functions of several items recited in the claims. The mere fact that certain measures are recited in mutually different dependent claims does not indicate that a combination of these measures cannot be used to advantage. A computer program may be stored/distributed on a suitable medium, such as an optical storage medium or a solid-state medium supplied together with or as part of other hardware, but may also be distributed in other forms, such as via the Internet or other wired or wireless telecommunication systems. Any reference signs in the claims should not be construed as limiting the scope.

The invention claimed is:

1. A current-sensor structure comprising:
    a conductor for conducting electrical current in a current direction, said conductor having one or more conductor surfaces, and
    a current sensor disposed on, over, or in contact with only one conductor surface of said conductor and offset from a center of said one conductor surface in an offset direction orthogonal to said current direction, said current sensor fully overlapping with said conductor surface;
    wherein said conductor has an edge and an edge or center of said current sensor is aligned with said conductor edge or wherein said conductor has a width W and the edge or center of said current sensor is within a distance of W/5 of the conductor edge, and
    wherein said conductor has a notch or a hole or a slot and a width at the notch or the hole or the slot, the width of the conductor at the notch or the hole or the slot extending across the conductor in a direction orthogonal to the current direction, and wherein the width of the conductor at the notch or the hole or the slot is smaller than an overall width of the conductor not at the notch of the hole or the slot, and the current sensor is disposed adjacent to said notch or said hole or slot.

2. The current-sensor structure as in claim 1, wherein said conductor has a length and a thickness, where said length is greater than said width W, said width W is greater than said thickness, and said offset direction is in a width direction.

3. The current-sensor structure as in claim 2, wherein said current sensor is not in direct contact with said one or more conductor surfaces and is distant from said conductor by a distance less than said width W.

4. The current-sensor structure as in claim 1, comprising a substrate or a printed-circuit board, wherein said conductor is disposed on, over, in contact with, embedded within or adjacent to said substrate or printed-circuit board.

5. The current-sensor structure as in claim 4, wherein said substrate or printed-circuit board comprises a ground plane, a power plane or an electrical field shield plane disposed between said current sensor and said conductor.

6. The current-sensor structure as in claim 1, wherein said current sensor is a two-axis or a three-axis magnetic field sensor.

7. The current-sensor structure as in claim 1, further comprising a plurality of current sensors disposed on, over, or in contact with only one conductor surface of said conductor, and wherein each of said plurality of current sensors is offset from a center of said conductor in an offset direction orthogonal to the current direction.

8. The current-sensor structure as in claim 7, wherein at least two current sensors of said plurality of current sensors are disposed in relation to said conductor to measure a magnetic field generated by an electrical current in different or opposite directions and to measure an external magnetic field in the same direction.

9. The current-sensor structure as in claim 7, wherein said conductor has a top surface area and a side surface area, the side surface area being smaller than said top surface area, and wherein a first current sensor and a second current sensor are both disposed in a line or plane parallel to the top surface or wherein said first current sensor and said second current sensor are both disposed in a line or plane parallel to said side surface.

10. The current-sensor structure as in claim 1, comprising a shield at least partially surrounding said conductor and said current sensor,
    wherein said conductor is disposed in, on, in contact with or over the shield, or on a layer disposed on the shield,
    wherein a cross section of said shield in a direction orthogonal to said current direction surface forms a U-shape, a plane or two parallel planes.

11. The current-sensor structure as in claim 1, comprising a laminated shield at least partially surrounding said conductor and said current sensor,
    wherein said laminated shield comprises lamination layers and said lamination layers are disposed orthogonally to said current direction or parallel to said current direction.

12. The current-sensor structure as in claim 1, comprising three or more conductors, each conductor having a longest dimension extending in a similar, parallel direction, each conductor conducting a phase of a three-phase current, and at least two conductors of said three or more conductors having at least one current sensor or having at least two current sensors.

13. The current-sensor structure as in claim 1, wherein said conductor has an edge and an edge of said current sensor is aligned with said conductor edge.

14. The current-sensor structure as in claim 1, wherein said conductor has a width W and the edge of said current sensor is within a distance of W/5 of the conductor edge.

15. The current-sensor structure as in claim 1, wherein said conductor has a width W and the center of said current sensor is within a distance of W/5 of the conductor edge.

16. The current-sensor structure as in claim 1, further comprising a shield at least partially surrounding said conductor and said current sensor,
    wherein said conductor is disposed in, on, in contact with or over the shield, or on a layer disposed on the shield, and
    wherein a cross section of said shield in a direction orthogonal to said current direction surface forms a U-shape.

17. The current-sensor structure as in claim 1, comprising a shield at least partially surrounding said conductor and said current sensor,
wherein said conductor is disposed in, on, in contact with or over the shield, or on a layer disposed on the shield,
wherein a cross section of said shield in a direction orthogonal to said current direction surface forms two parallel planes.

18. The current-sensor structure as in claim 1, wherein said conductor has a hole and said current sensor is disposed adjacent to said hole.

19. A current-sensor structure comprising:
a conductor for conducting electrical current in a current direction, said conductor having one or more conductor surfaces, and
a current sensor disposed on, over, or in contact with only one conductor surface of said conductor, the current sensor being offset from a center of said one conductor surface in an offset direction that is orthogonal to said current direction, said current sensor being arranged such that the current sensor does not extend beyond an edge of said conductor surface;
wherein said conductor has an edge and an edge or center of said current sensor is aligned with said conductor edge or wherein said conductor has a width W and the edge or center of said current sensor is within a distance of W/5 of the conductor edge, and
wherein said conductor has a notch or a hole or a slot and a width at the notch or the hole or the slot, the width of the conductor at the notch or the hole or the slot extending across the conductor in a direction orthogonal to the current direction, and wherein the width of the conductor at the notch or the hole or the slot is smaller than an overall width of the conductor not at the notch of the hole or the slot, and the current sensor is disposed adjacent to said notch or said hole or slot.

20. The current-sensor structure as in claim 1, wherein the current sensor comprises an integrated circuit and a package, the integrated circuit being molded in the package, wherein a width of the package is less than a width of the conductor.

21. The current-sensor structure as in claim 1, wherein the current-sensor structure further comprises a printed-circuit board, wherein said conductor is disposed on, over, in contact with, embedded within, or adjacent to said printed-circuit board.

* * * * *